United States Patent
Nakai et al.

(10) Patent No.: US 7,811,878 B2
(45) Date of Patent: Oct. 12, 2010

(54) METHOD OF MANUFACTURING SOI SUBSTRATE

(75) Inventors: Tetsuya Nakai, Tokyo (JP); Bong-Gyun Ko, Tokyo (JP); Takeshi Hamamoto, Yokohama (JP); Takashi Yamada, Ebina (JP)

(73) Assignees: Sumco Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/423,585

(22) Filed: Apr. 14, 2009

(65) Prior Publication Data

US 2009/0203187 A1   Aug. 13, 2009

Related U.S. Application Data

(62) Division of application No. 11/559,347, filed on Nov. 13, 2006, now Pat. No. 7,537,989.

(30) Foreign Application Priority Data

Nov. 18, 2005   (JP) .............................. 2005-333619

(51) Int. Cl.
 *H01L 21/8238* (2006.01)
(52) U.S. Cl. ...................... 438/218; 438/423; 438/526; 257/E21.563; 257/E21.564

(58) Field of Classification Search ................ 438/218, 438/219, 405, 423, 450, 514, 526, 530; 257/E21.563, 257/E21.564
See application file for complete search history.

(56) References Cited

U.S. PATENT DOCUMENTS 6,756,257 B2 *  6/2004  Davari et al. ................ 438/151
7,115,463 B2   10/2006  Sadana et al. ............... 438/218

FOREIGN PATENT DOCUMENTS

| JP | 05-082525 | 4/1993 |
| JP | 2001-308025 | 11/2001 |
| JP | 2006-120715 | 5/2006 |

* cited by examiner

*Primary Examiner*—Hoai v Pham
(74) *Attorney, Agent, or Firm*—Hogan Lovells US LLP

(57) ABSTRACT

To easily and accurately flush a substrate surface serving an SOI area with a substrate surface serving as a bulk area, make a buried oxide film, and prevent an oxide film from being exposed on substrate surface. After partially forming a mask oxide film 23 on the surface of a substrate 12 constituted of single crystal silicon, oxygen ions 16 are implanted into the surface of the substrate through the mask oxide film, and the substrate is annealed to form an buried oxide film 13 inside the substrate. Further included is a step of forming a predetermined-depth concave portion 12c deeper than substrate surface 12b serving as a bulk area on which the mask oxide film is formed on the substrate surface 12a serving as an SOI area by forming a thermally grown oxide film 21 on the substrate surface 12a serving as an SOI area on which the mask oxide film is not formed between the step of forming the mask oxide film and the step of implanting oxygen ions.

2 Claims, 11 Drawing Sheets

METHOD OF MANUFACTURING SOI SUBSTRATE

CROSS-REFERENCE TO THE RELATED APPLICATIONS

This application is a divisional of application Ser. No. 11/559,347, filed on Nov. 13, 2006, the entire contents of which are incorporated herein by reference. Also, this application claims the benefit of priority under 35 USC 119 to Japanese Patent Application No. 2005-333619, filed on Nov. 18, 2005, the entire contents of which are incorporated herein by reference.

BACKGROUND OF THE INVENTION

1. Field of the Invention

The present invention relates to a method for manufacturing a Silicon-On-Insulator (SOI) substrate partially having a buried oxide film in a silicon substrate by a Separation by IMplanted Oxygen (SIMOX) method.

2. Description of the Related Art

It is conventionally expected to use an SOI substrate having a buried oxide film in a silicon substrate for high-speed low-power-consumption device substrates. Among these device substrates, an SOI substrate having a buried oxide film in a silicon substrate not entirely but partially (hereafter referred to as "partial SOI substrate") is regarded to be important because it is possible to form only a logic portion in an SOI area of a buried oxide film in a system LSI including analog logic memories and to manufacture a memory portion at a bulk Si portion without the buried oxide film.

As this type of method for manufacturing the partial SOI substrate (method for manufacturing SIMOX substrate), the following method (for example, refer to Patent Document 1) is proposed. More particularly, as shown in FIG. 10, a surface oxide film 4 is first formed on the surface of a substrate 2 (substrate 2 is cut in a plane perpendicular to the axis of a single-crystal silicon rod)(FIG. 10 (a))) to form a patterned resist layer 6 on the surface of the surface oxide film 4 through photolithography (FIGS. 10(b) and 10(c)). Then, the surface oxide film 4 is patterned through anisotropic etching (FIGS. 10(d) and 10(e)) to remove the resist layer 6 (FIG. 10F) and then, the substrate 2 is cleaned. Then, oxygen ions 7 are implanted into the surface of the substrate 2 (FIG. 10(g)) and the substrate 2 is immersed in a mixed solution (etching solution) of hydrofluoric-acid ammonium aqueous solution and hydrofluoric acid to remove the surface oxide film 4 (FIG. 10(h)). Moreover, the substrate 2 is held at 1,300° C. or higher for predetermined time in the atmosphere of mixed gas of argon and oxygen or nitrogen and oxygen and is annealed to form a buried oxide film 3 (FIG. 10(i)), then the substrate 2 is immersed in a mixed solution (etching solution) of hydrofluoric-acid ammonium aqueous solution and hydrofluoric acid to remove the surface oxide film 4 (FIG. 10(j)).

Moreover, as shown in FIG. 11, the surface oxide film 4 is formed on the surface of the substrate 2 (substrate 2 is cut in a plane perpendicular to the axis of single-crystal silicon rod)(FIG. 11(a)) and a patterned resist layer 6 is formed on the surface of the surface oxide film 4 through photolithography (FIGS. 11B(b) and 11C(c)). Then, the surface oxide film 4 is patterned through anisotropic etching (FIGS. 11(d) and 11(e)) to remove the resist layer 6 (FIG. 11(f)) and then, the substrate 2 is cleaned. Then, oxygen ions 7 are implanted into the surface of the substrate 2 (FIG. 11(g)), the substrate 2 is held for predetermined time at 1300° C. or higher in the atmosphere of mixed gas of argon and oxygen or mixed gas of nitrogen and oxygen and is annealed to form the buried oxide film 3 (FIG. 11(h)). Furthermore, the substrate 2 is immersed in mixed solution (etching solution) of hydrofluoric-acid ammonium aqueous solution and hydrofluoric acid to remove the surface oxide film 4 (FIG. 11(i)).

However, as shown in FIG. 11(g), when implanting oxygen ions 7 into the substrate 2, the upside of the surface oxide film 4 left on the surface of the substrate 2 as a mask is expanded and deformed due to implantation of oxygen ions 7 and thus the buried depth at the end of the buried oxide film 3 is decreased. Then, an edge area is exposed on the surface of the substrate 2 because the end of the buried oxide film 3 becomes thicker at the time of subsequent annealing. When removing the surface oxide film 4, the edge area is etched, which occasionally causes a concave groove 8 to be formed on the surface of the substrate 2 along the edge area or cavity to be formed on the buried oxide film 3. To dissolve this point, it is proposed to vertically apply anisotropic etching to the surface of the substrate by using the surface oxide film as a mask and vertically implant oxygen ions into the surface of the substrate (for example, refer to Patent Document 2). In this method for manufacturing An SOI substrate, since oxygen ions are implanted in the direction vertical to the surface of a substrate, the edge area of a buried oxide film is not exposed on surface and even if immersing the substrate in an etching solution in order to remove a surface oxide film, the edge area of the buried oxide film is not removed. Therefore, it is possible to prevent an unnecessary concave groove from being formed on the surface of the substrate or unnecessary cavity from being formed on the buried oxide film.

[Patent Document 1] Japanese Patent Laid-Open No. H5-82525 (claim 2)

[Patent Document 2] Japanese Patent Laid-Open No. 2001-308025 (claim 1)

SUMMARY OF THE INVENTION

However, in the above conventional method for manufacturing SIMOX-substrate described in Patent Document 1, as shown in FIGS. 10(i) and 10(j), an oxygen ion area 9 serving as the buried oxide film 3 is expanded in volume at the time of annealing after implanting oxygen ions 7. This expansion further causes a substrate surface 2a serving as an SOI area to be expanded in more volume than a substrate surface 2b serving as a bulk area. As a result, a trouble that a step is formed on the surface of the substrate 2 after removing a surface oxide layer 8 occurs.

Moreover, in the conventional method described in Patent Document 1, as shown in FIG. 10(g), a recess portion 2c is partially formed on the substrate surface 2a serving as an SOI area due to sputtering of oxygen ions 7 when implanting oxygen ions 7. This presents fears that the thickness of the oxide film 3 after annealed is partially changed or the buried oxide film 3 is occasionally exposed on the surface of the substrate 2 after annealed as shown in FIG. 10(j).

Furthermore, in the above conventional method described in Patent Document 1, the periphery of the upper margin of a surface oxide film serving as a mask when implanting oxygen ions is occasionally deformed so as to be expanded. This deformation presents a fear that when a part of the surface oxide film is protruded to a portion serving as an SOI area not covered with the surface oxide film, a fear is presented that the implantation depth of oxygen ions to be implanted may be changed.

Furthermore, in the above method described in Patent Document 1, there is a problem that the peripheral portion of an oxygen ion area serving as a buried oxide film is more oxidized than the central portion of the oxygen ion area at the time of annealing after implanting oxygen ions and expanded in volume. That is, though the peripheral portion of oxygen ions implanted into the surface of the substrate is not exposed on the surface of the substrate after the ions are implanted, oxygen is supplied to the peripheral portion of an oxygen ion area from the surface as well as from the periphery at the time of subsequent annealing periphery. Therefore, more quantity of oxygen is supplied to the peripheral portion of the oxygen ion area as compared that to the central portion to which oxygen is supplied from only the surface direction and oxidation at the peripheral portion is more advanced as compared at the central portion at the time of annealing and thus the peripheral portion of the buried oxide film after annealed is increased in thickness as compared to the central portion. When increase in the thickness advances, there is a problem that the peripheral portion is exposed on the surface of the substrate.

Meanwhile, in the method for manufacturing an SOI substrate described in Patent Document 2, even if vertically implanting oxygen ions into the surface of the substrate, a problem to be solved is still left that oxidation at the peripheral portion of a buried oxide film is more advanced than at other portion. That is, peripheryoxygen ions implanted vertically into the surface of the substrate is not exposed on the surface of the substrate after the ions are implanted. However, oxygen is supplied to the periphery of the buried oxide film from the surface as well as from the periphery of the film at the annealing. Therefore, more quantity of oxygen is supplied as that compared to the central portion to which oxygen is supplied only from the surface direction so that oxidation at the peripheral portion is further advanced than at the central portion at the time of annealing, and thus the periphery of the buried oxide film after annealed is increased in thickness as compared at the central portion. When increase in the thickness advances, there is a trouble that the periphery of the buried oxide film is exposed on the substrate surface.

Moreover, in the conventional method described in Patent Document 2, it is known that the periphery of the upper margin of a surface oxide film serving as a mask when oxygen ions are implanted is deformed so as to be expanded. When a part of a surface oxide film is protruded to a portion not covered with the surface oxide film, a fear is presented that the implantation depth of oxygen ions to be implanted may be changed. Therefore, it is also necessary to effectively prevent the edge area of the obtained buried oxide film from being exposed on the surface of a substrate by inhibiting deformation in which a part of the surface oxide film is protruded to a portion not covered with the surface oxide film and uniforming the depth of the buried oxide film when oxygen ions are implanted.

It is the first object of the present invention to provide a method for manufacturing an SOI substrate capable of easily and accurately making a substrate surface serving as an SOI area flush with a substrate surface serving as a bulk area.

It is the second object of the present invention to provide a method for manufacturing an SOI substrate capable of uniforming the thickness of a buried oxide film and effectively preventing the buried oxide film from being exposed on substrate surface.

It is the third object of the present invention to provide a method for manufacturing an SOI substrate capable of uniforming the implantation depth of oxygen ions by preventing expansion and deformation of the periphery of the upper margin of a mask oxide film when oxygen ions are implanted.

It is the fourth object of the present invention to provide a method for manufacturing an SOI substrate capable of securely preventing the periphery of a buried oxide film from being exposed on substrate surface by preventing oxygen from a boundary area contacting with the side of a mask oxide film on the substrate surface serving as an SOI area.

As shown in FIG. 1, the invention of claim 1 is an improved method for manufacturing an SOI substrate including a step of partially forming a mask oxide film 23 on the surface of a substrate 12 made of single crystal silicon, a step of implanting oxygen ions 16 into the surface of the substrate 12 through the mask oxide film 23, and a step of annealing the substrate 12 to form a buried oxide film 13 inside the substrate 12.

The invention of claim 1 is characterized in further including a step of forming recess portion 12c with a predetermined-depth deeper than the surface of a substrate 12b serving as a bulk area on which the mask oxide film 23 is formed on the surface of a substrate 12a serving as an SOI area on which a mask oxide film 23 is not formed by forming a thermally grown oxide film 21 between the step of forming the mask oxide film 23 and the step of implanting oxygen ions 16.

In the method described in claim 1, it is possible to form recess portion 12c with a predetermined-depth deeper than the substrate surface 12b serving as a bulk area on the substrate surface 12a serving as an SOI area by forming a thermally-oxidized film 21 on the substrate surface 12a between a step of forming a mask oxide film 23 and a step of implanting oxygen ions 16. As a result only the substrate surface 12a serving as an SOI area is lifted due to volume expansion of an area 20 of oxygen ions implanted into the substrate 12 and thus the substrate surface 12a becomes flush with the substrate surface 12b. Moreover, because the substrate surface 12a serving as an SOI area is covered with the above thermally grown oxide film 21, it is possible to prevent the substrate surface 12a serving as an SOI area due to sputtering generated along with oxygen ion implantation from being partially etched.

As shown in FIG. 2, the invention of FIG. 2 is characterized in further including between a step of forming the mask oxide film 23 and a step of implanting oxygen ions 16, a step of forming a buffer film 32 on a substrate surface 12a serving as an SOI area on which a mask oxide film 23 is not formed, and on the upside and the side of the mask oxide film.

In the method described in FIG. 2, included is a step that the buffer film 32 is formed on the substrate surface 12a on which the mask oxide film 23 is not formed, and on the upside and the side of the mask oxide film 23 between the step of forming the mask oxide film 23 and the step of implanting oxygen ions 16. As a result, though sputtering occurs along with implantation of oxygen ions 16, because the substrate surface 12a serving as an SOI area is covered with the buffer film 32, it is possible to prevent the substrate surface 12a serving as an SOI area from being partialpartially etched through sputtering. Moreover, because the buffer film 32 formed on the side of the mask oxide film 23 prevents the upper margin of the mask oxide film 23 from being deformed so as to expand when implanting oxygen ions 16, it is possible to uniform the implantation depth of oxygen ions 16.

As shown in FIG. 3, the invention of FIG. 3 is characterized in further including between a step of implanting oxygen ions 16 and a step of performing annealing the substrate 12, a step of etching a mask oxide film 23 so as to become a predetermined thickness and a step of forming a buffer film 42 on a predetermined-width boundary area contacting with the side of the mask oxide film 23 on a silicon substrate surface 12a serving as an SOI area and on the side of the mask oxide film 23.

The method described in FIG. 3 further includes a step of etching the mask oxide film 23 so as to become a predetermined thickness and forming the buffer film 42 on a predetermined-width boundary area contacting with the side of the mask oxide film 23 of a silicon substrate surface 12a serving as an SOI area and on the side of the mask oxide film 23. In a case of annealing the boundary area contacting with the side of the mask oxide film 23 decreased in thickness on the substrate surface 12a serving as an SOI area and the side of the mask oxide film 23 decreased in thickness while they are exposed without being covered with the buffer film 42, oxidation is further advanced than at the central portion at the time of annealing, and thus the peripheral portion of a buried oxide film 13 after annealed is increased in thickness and there is a fear that the peripheral portion may be exposed on substrate surface 12a. However, in the invention of claim 3, the boundary area in the substrate surface 12a serving as an SOI area, contacting with the side of the mask oxide film 23 decreased in thickness and the side of the mask oxide film 23 decreased in thickness are covered with a buffer film 42, so that it is possible to prevent oxygen from entering from the boundary area. As a result, it is possible to securely prevent the periphery of the buried oxide film 13 from being exposed on the surface of the substrate 12.

As shown in FIG. 4, the invention of FIG. 4 is characterized in further including between a step of implanting oxygen ions 16 and a step of performing annealing the substrate 12, a step of forming a buffer film 52 on a predetermined-width boundary area contacting with the side of a mask oxide film 23 on a silicon substrate surface 12a serving as an SOI area and on the side of the mask oxide film 23 and a step of etching the mask oxide film 23 so as to become a predetermined thickness.

The method described in FIG. 4 further includes a step of forming the buffer film 52 on the predetermined-width boundary area contacting with the side of the mask oxide film 23 on the silicon substrate surface 12a serving as an SOI area and on the side of the mask oxide film 23 and a step of etching the mask oxide film 23 so as to become a predetermined thickness between the step of implanting oxygen ions 16 and the step of annealing the substrate 12. In a case of annealing the boundary area contacting with the side of the mask oxide film 23 decreased in thickness of the substrate surface 12a serving as an SOI area and the side of the mask oxide film 23 while they are exposed without being covered with a buffer film 42, oxidation at the peripheral portion is further advanced than at the central portion and thus the peripheral portion of a buried oxide film 13 is increased in thickness and there is a fear the peripheral portion may be exposed on the substrate surface 12a. However, in the invention of claim 4, because the boundary area contacting with the side of the mask oxide film 23 decreased in thickness of the substrate surface 12a serving as an SOI area and the side of the mask oxide film 23 decreased in thickness are covered with the buffer film 52, even if isotropic etching easier than anisotropic etching is used for decrease of the mask oxide film 23 in thickness instead of using a resist layer, the side of the mask oxide film 23 is not etched, so that it is possible to prevent oxygen from entering from the boundary area. As a result, it is possible to securely prevent the periphery of the buried oxide film 13 from being exposed on the surface of the substrate 12.

As shown in FIG. 5, the invention of FIG. 5 is an improved method for manufacturing an SOI substrate including a step of partially forming a mask oxide film 23 on the surface of a silicon substrate 12, a step of implanting oxygen ions 16 into the surface of the substrate 12 through the mask oxide film 23, and a step of annealing the substrate 12 to form a buried oxide film 13 inside the substrate 12.

The invention of FIG. 5 is characterized in further including a step of implanting silicon ions 62 into the surface of a silicon substrate 12 corresponding to the periphery of a buried oxide film 13 to be formed before forming the mask oxide film 23 or between a step of forming the mask oxide film 23 and a step of implanting oxygen ions 16.

In the method described in FIG. 5, silicon ions 62 are implanted into the surface of the silicon substrate 12 corresponding to the periphery of the buried oxide film 13 to be formed before implanting oxygen ions. Therefore, the silicon ions inhibit oxidation around the buried oxide film at the time of subsequent annealing so that avoided is a situation in which thickness is further increased as compared to other portion. As a result, it is prevented that an edge area on the periphery of the buried oxide film due to the expansion is exposed on the surface of the substrate.

As shown in FIG. 6, the invention of claim 7 is an improved method for manufacturing an SOI substrate including a step of partially forming a mask oxide film 23 on the surface of a silicon substrate 12, a step of implanting oxygen ions 16 into the surface of the substrate 12 through the mask oxide film 23, and a step of annealing the substrate 12 to form a buried oxide film 13 inside the substrate 12.

The invention of FIG. 6 is characterized in further including a step of forming a concave groove 72 on the surface of a silicon substrate 12 corresponding to the periphery of a buried oxide film 13 to be formed before forming a mask oxide film 23 or between a step of forming the mask oxide film 23 and a step of implanting oxygen ions 16.

In the method of FIG. 6, since a concave groove 72 is formed on the surface of the silicon substrate 12 corresponding to the periphery of the buried oxide film 13 to be formed before implanting oxygen ions, the periphery of the buried oxide film obtained through implantation of oxygen ions is kept at a distance from the surface of the substrate 12 along the concave groove 72. Therefore, even if the thickness around the buried oxide film is further increased than other portion at the time of annealing, the edge area on the periphery of the buried oxide film does not reach the surface of the substrate nor is exposed on the surface.

As shown in FIG. 7, the invention of FIG. 7 is an improved method for manufacturing an SOI substrate including a step of partially forming a mask oxide film 23 on the surface of a silicon substrate 12, a step of implanting oxygen ions 16 into the surface of a substrate 12 through the mask oxide film 23, and a step of annealing the substrate 12 to form a buried oxide film 13 inside the substrate 12.

The invention of FIG. 7 is characterized in that the implantation of oxygen ions 16 is performed a plurality of times separately and the present invention further includes a step of etching the margin of a mask oxide film 23 between the precedent oxygen-ion implanting step and the subsequent oxygen-ion implanting step.

As shown in FIG. 8, the present invention of FIG. 8 is an improved method for manufacturing an SOI substrate including a step of partially forming a mask oxide film 23 on the surface of a silicon substrate 12, a step of implanting oxygen ions 16 into the surface of the substrate 12 through the mask oxide film 23, and a step of annealing the substrate 12 to form a buried oxide film 13 inside the substrate 12.

The invention of FIG. 8 is characterized in that the implantation of oxygen ions 16 is performed a plurality of times separately and the present invention further including a step of enlarging the margin of a mask oxide film 23 between the precedent oxygen-ion implanting step and the subsequent oxygen-ion implanting step.

In the methods described in FIG. 8, Since between each step of implanting oxygen ions 16 a plurality of times separately, the margin of the mask oxide film 23 is decreased by etching or enlarged by overlaying to the periphery of the mask oxide film 23 to expand the periphery, the periphery of a buried oxide film obtained through implantation of oxygen ions a plurality of times becomes thinner than other portions. Therefore, even if the thickness at the periphery of the buried oxide film is further increased as compared to other portions at the time of subsequent annealing, and thus the edge area on the periphery of the buried oxide film does not reach the surface of a substrate nor is exposed on the surface.

As shown in FIG. 9, the invention of FIG. 9 is an improved method for manufacturing an SOI substrate including a step of partially forming a mask oxide film 23 on the surface of a silicon substrate 12, a step of implanting oxygen ions 16 into the surface of the substrate 12 through the mask oxide film 23, and a step of annealing the substrate 12 to form a buried oxide film 13 inside the substrate 12.

The invention of FIG. 9 is characterized in that the step of forming the mask oxide film 23 includes a step of forming a surface oxide film 14 on the surface of the substrate 12, a step of forming a resist layer 17 having a predetermined pattern on the surface of the surface oxide film 14, a step of applying isotropic etching to the surface oxide film 14 by using the resist layer 17 as a mask to decrease the thickness of the surface oxide film 14 not masked with the resist layer 17, a step of removing the surface oxide film 14 decreased in thickness because of vertically applying anisotropic etching to the surface of the substrate 12 by using the resist layer 17 as a mask, and a resist removing step of removing the resist layer 17 and making the surface oxide film 14 partially left on the surface of the substrate 12 as the mask oxide film 23 to form a recess portion 23a on the upper corner of the obtained mask oxide film 23.

In the method described in FIG. 9, Since the recess portion 23a is formed on the upper corner of the mask oxide film 73, even if the upper margin of the mask oxide film 73 is deformed so as to be expanded when implanting oxygen ions, the deformed portion is not protruded to a portion not covered with the mask oxide film 73 and thus implantation depth of implanted oxygen ions is not changed. Therefore, the depth of the buried oxide film obtained through oxygen ion implantation becomes uniform and the edge area of the buried oxide film can effectively prevent the edge area of the buried oxide film from being exposed on the surface of the substrate.

As described above, according to the present invention, by forming a thermally grown oxide film on the substrate surface serving as an SOI area on which the mask oxide film is not formed between the step of forming the mask oxide film and the step of implanting oxygen ions, a recess portion with a predetermined-depth deeper than the substrate surface serving as a bulk area on which the mask oxide film is formed is formed on the substrate surface serving as an SOI area. Therefore, only the substrate surface serving as an SOI area is lifted due to the volume expansion of the area of oxygen ions implanted into the substrate at the time of annealing, and the substrate surface serving as an SOI area becomes flush with the substrate surface serving as a bulk area. As a result, it is possible to make the substrate surface serving as an SOI area and the substrate surface serving as a bulk area easily and accurately flush so that it is possible to prevent a focus from being shifted in a subsequent photolithography step of an SOI substrate. Moreover, because the substrate surface serving as an SOI area is covered with the above thermally grown oxide film, it is possible to inhibit the substrate surface serving as an SOI area from being partially etched due to sputtering along with oxygen ion implantation. As a result, it is possible to uniform the thickness of the buried oxide film nor is exposed on the substrate surface. Therefore, because the buried oxide film is not etched when etching an oxide layer on the surface of the substrate formed after annealing, a hole serving as a particle occurrence source is not formed on the substrate. Moreover, because it is possible to simultaneously form the recess portion and thermally grown oxide film only by the comparatively simple treatment referred to as thermal oxidation, only a small number of man hours for forming the recess portion and thermally grown oxide film is required.

Moreover, by including a step of forming a buffer film on the substrate surface serving as an SOI area on which a mask oxide film is not formed and on the upside and the side of the mask oxide film, the substrate surface serving as an SOI area is covered with the buffer film so that it is possible to prevent the substrate surface serving as an SOI area from being partially etched due to sputtering along with oxygen ion implantation. Moreover, because the buffer film formed on the side of the mask oxide film presents the upper margin of the mask oxide film from being deformed so as to be expanded when implanting oxygen ions, it is possible to uniform the implantation depth of oxygen ions.

Furthermore, by including a step of forming a buffer film on the predetermined-width boundary area contacting with the side of a mask oxide film on the silicon substrate surface serving as an SOI area and on the side of the mask oxide film after etching the mask oxide film to form the predetermined thickness between a step of implanting oxygen ions and a step of performing annealing, the predetermined-width boundary area contacting with the side of the mask oxide film on the substrate surface serving as an SOI area and the side of the mask oxide film decreased in thickness are covered with the buffer film so that it is possible to prevent oxygen from entering from the boundary area. As a result, it is possible to securely prevent the periphery of the buried oxide film from being exposed on the surface of the substrate.

Furthermore, between a step of implanting oxygen ions and a step of performing annealing, by forming a buffer film on the predetermined-width boundary area contacting with the side of a mask oxide film on the silicon substrate surface serving as an SOI area and the side of the mask oxide film and then, by etching the mask oxide film to form a predetermined thickness the boundary area contacting with the side of the mask oxide film decreased in thickness on the substrate surface serving as an SOI area and the side of the mask oxide film are covered with the buffer film so that, even if isotropic etching easier than anisotropic etching for decrease in thickness of the mask oxide film without using a resist layer is used, because the side of the mask oxide film is not etched, it is possible to prevent oxygen from entering from a boundary area As a result, it is possible to securely prevent the periphery of the buried oxide film from being exposed on the surface of the substrate.

Silicon ions are implanted into the surface of a silicon substrate corresponding to the periphery of a buried oxide film to be obtained or a concave groove is formed on the surface of the silicon substrate before forming a mask oxide film or between a step of forming the mask oxide film and a step of implanting oxygen ions. When implanting silicon ions, it is possible to avoid the situation that the silicon ions inhibit oxidation around the buried oxide film at the time of subsequent annealing so that the thickness of the periphery is further increased as compared to other portion. When forming a concave groove, it is possible to keep the periphery of a buried oxide film obtained through oxygen ion implantation at a distance from the surface of the substrate. As a result, it is possible to prevent the edge area around the buried oxide film from reaching the surface of the substrate and being exposed on the surface of the substrate.

Moreover, when performing oxygen ion implantation a plurality of times separately, it is possible to decrease the periphery of a buried oxide film in thickness as compared to other portion by etching and decreasing the margin of a mask oxide film or by weld-overlaying and enlarging the periphery of the mask oxide film between a precedent oxygen-ion implanting step and a subsequent oxygen-ion implanting stepperiphery. Thus, by decreasing the periphery of the oxide film obtained through oxygen ion implantation in thickness as compared to other portion, it is possible to prevent that the edge area on the periphery of the buried oxide film is exposed on the surface of the substrate due to the thickness of the periphery of the buried oxide film further increased as compared to other portion at the time of subsequent annealing.

Furthermore, by forming a recess portion on the upper corner of the mask oxide film, even if the upper margin on the mask oxide film is deformed so as to be extended at the time of oxygen ion implantation, the deformed portion is not protruded to a portion not covered with the mask oxide film and thus the implantation depth of implanted oxygen ions is not changed. Therefore, the thickness of the buried oxide film obtained trough oxygen ion implantation becomes uniform and it is possible to prevent the edge area of the buried oxide film from being exposed on the surface of a substrate.

DESCRIPTION OF THE PREFERRED EMBODIMENTS

Then, preferred embodiments of the present invention are described below by referring to the accompanying drawings.

First Embodiment

Figure 1:
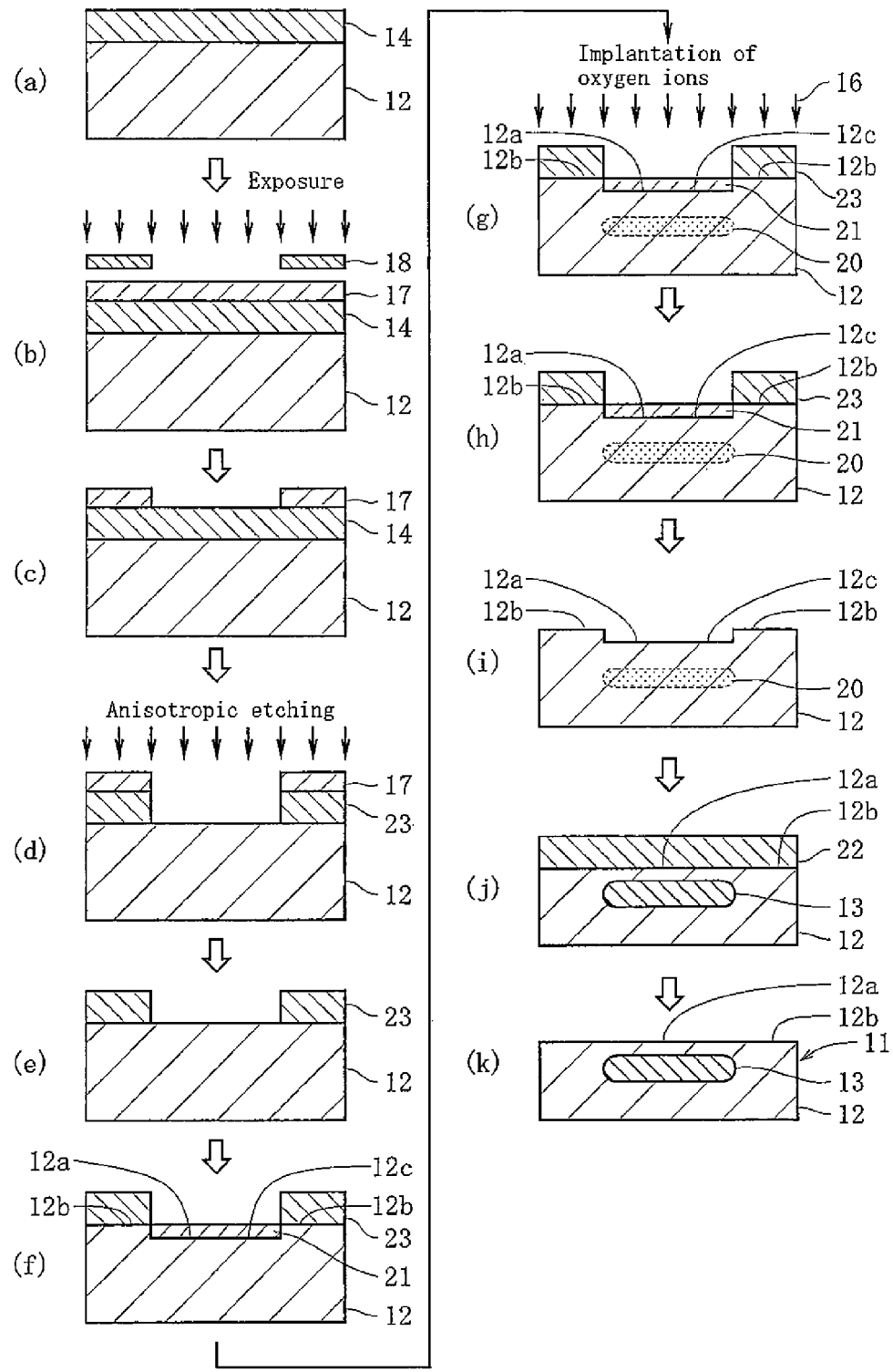
FIG. 1 is sectional view showing the method for manufacturing an SOI substrate of first embodiment of the present invention in order of step.

As shown in FIG. 1(k), an SOI substrate 11 has a silicon substrate 12 and a buried oxide film 13 formed inside the substrate 12. The substrate 12 is cut in a sliced form along a plane perpendicular to the axis of a single-crystal silicon rod grown by Czochralski (CZ) method [plane (100) of a crystal structure of a single crystal silicon]. Moreover, a buried oxide film 13 is formed as described below. It is allowed to cut a substrate from a single-crystal silicon rod or single-crystal silicon plate grown not by the CZ method but by the floating zone (FZ) method or the like.

Firstly, a surface oxide film 14 is formed on the surface of the substrate 12 (FIG. 1(a)). This surface oxide film 14 is a silicon oxide film ($SiO_2$ film), which is formed by thermally oxidizing the substrate 12 or with the CVD method (chemical vapor deposition method). Moreover, the surface oxide film 14 is formed in the thickness range between 200 and 1,000 nm, preferably in the thickness range between 500 and 800 nm. This limitation of the thickness of the surface oxide film 14 in the range between 200 and 1,000 nm is because there is a fear that oxygen ions 16 to be described later may pass through the surface oxide film 14 and be implanted into the substrate 12 and because it is possible to sufficiently cut off the oxygen ions 16 at 1,000 nm or less. Then, a resist layer 17 having a predetermined pattern is formed on the surface of the surface oxide film 14 through photolithography (FIGS. 1(b) and 1(c)). The predetermined pattern is formed on the resist layer 17 by exposing the resist layer 17 by a photomask 18 (FIG. 1(b)) and going through development and rinsing (FIG. 1(c)).

Anisotropic etching is vertically applied to the surface oxide film 14 for the surface of the substrate 12 by using the above resist layer 17 as a mask (FIG. 1(d)). The anisotropic etching is reactive ion etching in this embodiment. In the reactive ion etching, though not illustrated, by mounting a substrate on the lower electrode of two opposite electrodes set in a reactive chamber and applying a high-frequency voltage to these electrodes to induce plasma, radical-ion nuclear species higher in reactivity than etching gas such as $CF_4$ or $SF_6$ is formed, the radical ions at several tens to several hundreds of eV enter the substrate 12, and etching of the surface oxide film 14 is advanced by both effects of sputtering action and chemical reaction due to the radical ions. Therefore, the inner margin of the surface oxide film 14 becomes a vertical etching shape free from undercut. Incidentally, It is allowed to use ECR plasma etching as anisotropic etching. After the etching is completed, the resist layer 17 is removed by a sulfuric acid/hydrogen peroxide solution or the like, a mask oxide film 23 formed of the surface oxide film 14 left on the surface of the substrate without being etched and having a thickness of 200 to 1,000 nm is partially formed on the surface of the substrate 12 (FIG. 1(e)) and then cleaned.

Then, a recess portion 12c with the depth deeper than the substrate surface 12b serving as a bulk area on which the mask oxide film 23 is formed on the substrate surface 12a serving as an SOI area on which the mask oxide film 23 is not formed. In this embodiment, a step of forming the predetermined-thickness thermally grown oxide film 21 on the substrate surface 12a serving as an SOI area corresponds to a step of forming the thermally grown oxide film 21 on the substrate surface 12a serving as an SOI area (FIG. 1(f)). That is, by thermally oxidizing the substrate surface 12a serving as an SOI area and forming the thermally grown oxide film 21 on the substrate surface 12a, a recess portion 12c with a predetermined-thickness deeper than the substrate surface 12b serving as a bulk area on which the mask oxide film 23 is formed. The depth of the recess portion 12c is equivalent to the volume expansion of the buried oxide film 13 formed after the annealing to be described later and is previously obtained through an experiment. Specifically, the depth of the above 12c is the difference between the thickness of the area 20 of oxygen ions implanted into the substrate 12 and the thickness of the buried oxide film 13 formed when the oxygen ion area 20 is expanded in volume through annealing and is 30 to 80% of the thickness of the buried oxide film 13 after annealed, preferably 55%. The buried oxide film 13 is generally formed with a predetermined thickness in the range between 20 and 200 nm. However, when the thickness of the buried oxide film 13 is 20 nm, the depth of the above recess portion 12c is 6 to 10 nm, preferably 11 nm. When the thickness of the buried oxide film 13 is 200 nm, the thickness of the above recess portion 12c is 105 to 115 nm, preferably into 110 nm. In this case, the thickness of the above recess portion 12c is limited to the range of 30 to 80% because it is possible to implant oxygen ions 16 into the substrate 12 through the above thermally grown oxide film 21 and in order to eliminate a step formed between the substrate surface 12a serving as an SOI area and the substrate surface 12b serving as a bulk area after annealed. Though a state completely free from the above step is the best, a slight step may occur due to an error of a target thickness of the thermally grown oxide film 21 or to a target thickness of the buried oxide film 13. When the step is 30 nm or less, it is possible to prevent a focus from being shifted in a subsequent photolithography step.

Then, oxygen ions 16 are implanted into the surface of the substrate 12 by using the mask oxide film 23 as a mask (FIGS. 1(g) and 1(h)). In the implanting condition of oxygen ions 16, the implanting quantity ranges between $1\times10^{17}/cm^2$ and $2\times10^{18}/cm^2$, preferably between $2\times10^{17}/cm^2$ and $5\times10^{17}/cm^2$ and the implantation energy ranges between 20 keV and 200 keV, preferably between 60 keV and 180 keV. After implanting oxygen ions 16, the mask oxide film 23 and thermally grown oxide film 21 are removed from the surface of the substrate 12 through wet etching (isotropic etching) (FIG. 1(i)). Thereby, the above recess portion 12c is exposed on the substrate surface 12a serving as an SOI area. Though sputtering occurs along with oxygen ion implantation when implanting oxygen ions, the substrate surface 12a serving as an SOI area is covered with the thermally grown oxide film 21 so that it is possible to prevent the substrate surface 12a serving as an SOI area from being partially etched due to sputtering. After implanting oxygen ions, the substrate 12 is immersed in a mixed solution of hydrofluoric-acid ammonium aqueous solution and hydrofluoric acid (etching solution) to remove the mask oxide film 23 and thermally grown oxide film 21 from the surface and moreover, annealing where the substrate 12 is held in an oxidizing atmosphere at 1300 to 1380° C. for 2 to 20 hours and then slowly colled (FIG. 1(j)). The oxidizing atmosphere is exemplified by a mixed gas atmosphere of argon and oxygen or mixed gas atmosphere of nitrogen and oxygen including a mixed gas atmosphere of inert gas and oxygen. In this case, the oxidizing atmosphere contains 100 volume percent of oxygen. Preferable content of oxygen ranges between 0.5 and 90 volume percent and more preferable content ranges between 40 and 70 volume percent. This is because it is impossible to expect oxidation on the surface of the substrate 12 at the time of annealing to be described later when the oxygen percentage content is less than 0.5%.

Oxidation of the oxygen ion area 20 of the substrate 12 is accelerated by the annealing and the buried oxide film 13 is formed inside the substrate 12. When forming the buried oxide film 13, an oxygen ion area serving as the buried oxide film 13 is expanded in volume, only the substrate surface 12 serving as an SOI area is expanded and lifted so as to embed the recess portion 12c, and the substrate surface 12a serving as an SOI area becomes flush with the substrate surface 12b serving as a bulk area. At the same time, an oxidized layer 22 due to annealing is formed on the surface of the substrate 12.

After forming the buried oxide film 13 through the above annealing, the substrate 12 is immersed in a mixed solution of hydrofluoric-acid ammonium aqueous solution and hydrofluoric acid (etching solution) to remove the oxidized layer 22 (FIG. 1(k)). Then, the surface of the SOI substrate 11 becomes flat without step. Thus, it is possible to easily and accurately make the substrate surface 12 serving as an SOI area and substrate surface 12b serving as a bulk area after annealed flush. Thereby, it is possible to prevent the focus of the above SOI substrate 11 from being shifted even if exposing the SOI substrate 11 in a photolithography step.

As described above, by filling the above recess portion 12c with the thermally grown oxide film 21 formed through thermal oxidation between a step of forming the recess portion 12c and a step of implanting oxygen ions 16, it is possible to prevent the substrate surface 12a serving as an SOI area through the sputtering generated along with oxygen ion implantation from being partially etched so that it is possible to uniform the thickness of the buried oxide film 13 and the buried oxide film 13 is not exposed on the surface of the substrate 12. As a result, the buried oxide film 13 is not etched when etching the oxidized layer 22 on the surface of the substrate 12 formed through annealing and thus a hole serving as a particle generating source is not formed on the substrate 12.

Second Embodiment

Figure 2:
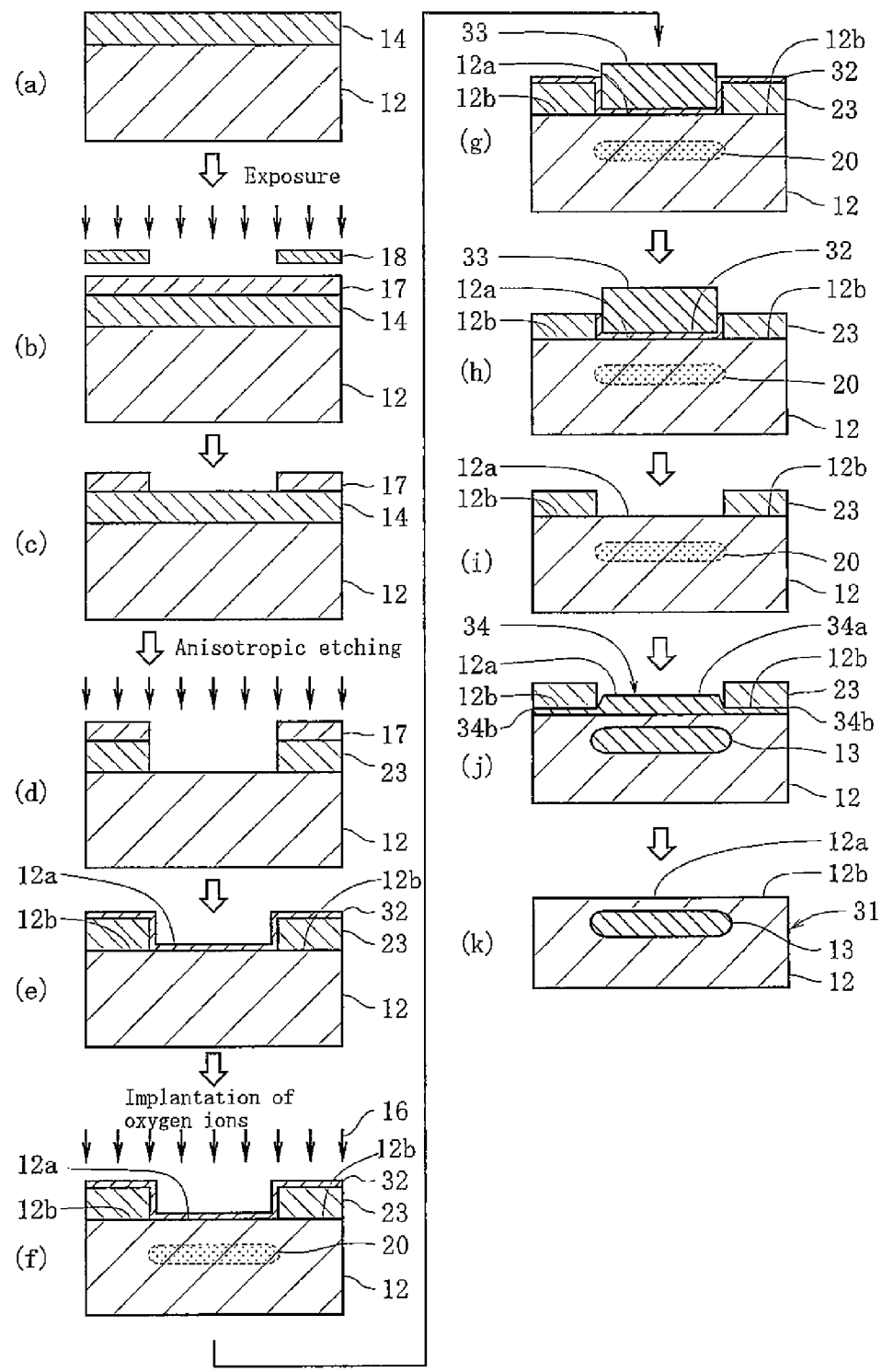
FIG. 2 is sectional view corresponding to FIG. 1, showing second embodiment of the present invention.

FIG. 2 shows second embodiment of the present invention. In FIG. 2, a numeral same as that in FIG. 1 denotes the same component.

This embodiment further includes a step of forming a buffer film 32 on the substrate surface 12a serving as an SOI area where a mask oxide film 23 is not formed and on the upside and the side of a mask oxide film 23. Specifically, a buffer film 32 made of silicon nitride is formed on the substrate surface 12a serving as an SOI area and the upside and the side of the mask oxide film 23 after vertically anisotropically etching a surface oxide film 14 vertically to the surface of a substrate 12 by using a resist layer 17 as a mask (FIG. 2(d)) before implanting oxygen ions 16 (FIG. 2(f)). The thickness of the buffer film 32 ranges between 5 and 500 nm, preferably between 20 and 200 nm. This limitation of the thickness of the buffer film 32 in the range of 5 to 500 nm because it is impossible to prevent oxygen from entering from a boundary area at the time of the annealing to be described later when the thickness is less than 5 nm and dead space is increased in device design when the thickness exceeds 500 nm. Incidentally, it is also allowed to form a buffer film of polysilicon or α silicon instead of silicon nitride. Then, oxygen ions 16 are implanted into the surface of the substrate 12 by using the mask oxide film 23 as a mask (FIG. 2(f)). The implanting condition of oxygen ions 16 is the same as in the first embodiment. Though sputtering occurs along with oxygen ion implantation, substrate surface 12a serving as an SOI area is covered with the buffer film 32 so that it is possible to prevent the substrate surface 12a serving as an SOI area from being partially etched. Moreover, Though the upper margin of the mask oxide film 23 may be deformed so as to expand above the substrate surface 12a when implanting oxygen ions 16, the buffer film 32 formed on the side of the mask oxide film 23 prevents the above expansion deformation so that it is possible to uniform the implantation depth of oxygen ions 16.

Then, after removing the buffer film 32 from the upside of the mask oxide film 23. More particularly the mask oxide film 23 is decreased in thickness so that the difference between thicknesses of the oxide film 34a to be formed on the substrate surface 12a serving as an SOI area and that of an oxide film 34b to be newly formed on the substrate surface 12b serving as a bulk area at the time of annealing to be described later (thickness of oxide film 34a minus thickness of oxide film 34b) becomes 0.7 to 1.3 times, preferably 0.9 to 1.1 times larger than the thickness of a buried oxide film 13 to be described later Then, as shown in FIGS. 2(g) and 2(h), this embodiment shows a case of decreasing the mask oxide film 23 on the surface of the substrate 12 in thickness to form a thin mask oxide film 23. This decreasing the mask oxide film 23 in thickness is performed by anisotropically etching the mask oxide film 23. The anisotropic etching of the above mask oxide film 23 is performed after forming a resist layer 33 on the substrate surface 12a serving as an SOI area on which the mask oxide film 23 is not formed (FIG. 2(g)). The resist layer 33 is formed in accordance with the same procedure as in the case of the resist layer 17. Specifically, a resist layer is formed on the entire surface of the substrate 12 on which the buffer film 32 is formed through photolithography; the resist layer is exposed by using a photomask and developed and rinsed; and the resist layer formed on the mask oxide film 23 is removed to leave the resist layer 33 at the side of the mask oxide film 23 and at the substrate surface 12a serving as an SOI area on which the mask oxide film 23 is not formed.

As shown in FIG. 2(h), anisotropic etching is vertically applied to the surface of the substrate 12 by using the resist layer 33 as a mask to remove the whole buffer film 32 from the upside of the mask oxide film 23 and then the mask oxide film 23 is decreased in thickness to form a mask oxide film 23 with thickness decreased as compared to the thickness of the buried oxide film to be described later. Anisotropic etching is reactive ion etching. In this case, the thickness of the mask oxide film 23 decreased in thickness is limited to the range of 0.7 to 1.3 times of the thickness of the buried oxide film 13 for the following reason. When the thickness of the buried oxide film 13 is less than 0.7 times, the substrate surface 12a serving as an SOI area on which the mask oxide film 23 decreased in thickness is not formed at the time of the annealing to be described later becomes higher than the substrate surface 12b serving as a bulk area on which the mask oxide film 23 decreased in thickness is formed and a state that the substrate surface 12a is present at the step or higher causes the problem of focus shift in the photolithography step to occur. Meanwhile when the thickness exceeds 1.3 times, the substrate surface 12a serving as an SOI area on which the mask oxide film 23 decreased in thickness at the time of the annealing to be described later is not formed becomes lower than the substrate surface 12b serving as a bulk area on which the mask oxide film 23 decreased in thickness is formed and a state that the substrate surface 12a is present at the step or higher causes a problem of focus shift in the photolithography step to occur. After decreasing the mask oxide film 23 in thickness, the resist layer 33 is removed by a sulfuric acid/hydrogen peroxide solution or the like; the buffer film 32 is immersed in an etching solution such as thermal phosphoric acid, hydrofluoric acid or the like, be removed, and cleaned. Incidentally, in this embodiment, though anisotropic etching is used as means for removing a buffer film from the upside of a mask oxide film and decreasing the mask oxide film in thickness, it is also allowed to use isotropic etching such as wet etching as the above removing means and film-thickness decreasing means.

Then, the annealing where the substrate 12 is held in an oxidizing atmosphere at a temperature range between 1,300 and 1380° C. for 2 to 20 hours and then slowly cooled is performed similarly to the first embodiment (FIG. 2(j)). By this annealing, oxidation of the oxygen ion area 20 into which oxygen ions 16 are implanted into the substrate 12 is accelerated and the buried oxide film 13 is formed inside the substrate 12. When forming the buried oxide film 13, only the substrate surface 12a serving as an SOI area is lifted due to volume expansion of the above oxygen ion area 20, that is, the thickness-directional expansion of the oxygen-ion area 20 and thus a step occurs between the substrate surface 12a serving as an SOI area on which the buried oxide film 13 is formed and the substrate surface 12b serving as a bulk area on which the buried oxide film 13 is not formed as shown in FIG. 2(j). while this step is performed, because annealing is performed by horizontally setting the substrate 12 in a furnace, the surface of the substrate 12 is oxidized to form an oxide layer 34. Formation of the oxide layer 34 is quickly progressed on the substrate surface 12a on which the mask oxide film 23 decreased in thickness is not formed, that is, substrate surface 12a serving as an SOI area on which the buried oxide film 13 is formed while it is slowly progressed on the substrate surface 12b on which the mask oxide film 23 decreased in thickness is formed, that is, substrate surface 12b serving as a bulk area on which the buried oxide film 13 is not formed. As a result, in a state that the buried oxide film 13 is formed, the oxidized layer 34 has the thick-layer portion 34a of the substrate surface 12a serving as an SOI area and the thin-layer portion 34b of the substrate surface 12b serving as a bulk area. Therefore, though the expansion in volume of oxygen-ion area 20 due to annealing causes the substrate surface 12a serving as an SOI area to be lifted and thus a step is formed between the substrate surface 12a serving as an SOI area and the substrate surface 12b serving as a bulk area, the step is absorbed by the difference between thick-layer portion 34a and thin-layer portion 34b of the oxide layer 34 formed on the substrate 12.

After forming the buried oxide film 13 by annealing, the substrate 12 is immersed in a mixed solution (etching solution) of hydrofluoric-acid ammonium aqueous solution and hydrofluoric acid to remove the mask oxide film 23 decreased in thickness and an oxidized layer 34 newly formed on the surface of the substrate 12 at the time of annealing (FIG. 2(k)). Then, the step formed on the surface of the substrate 12 due to the expansion in volume of the buried oxide film 13 almost or completely disappears by removing the thick-layer portion 34a and thin-layer portion 34b of the oxidized layer 34 so that it is possible to set the step between the substrate surface 12a serving as an SOI area on which the buried oxide film 13 is formed and the substrate surface 12b serving as a bulk area on which the buried oxide film 13 is not formed to 0 to 30 nm. By using the SOI substrate 31, it is possible to solve the problem that a focus is shifted in the photolithograph step.

Third Embodiment

Figure 3:
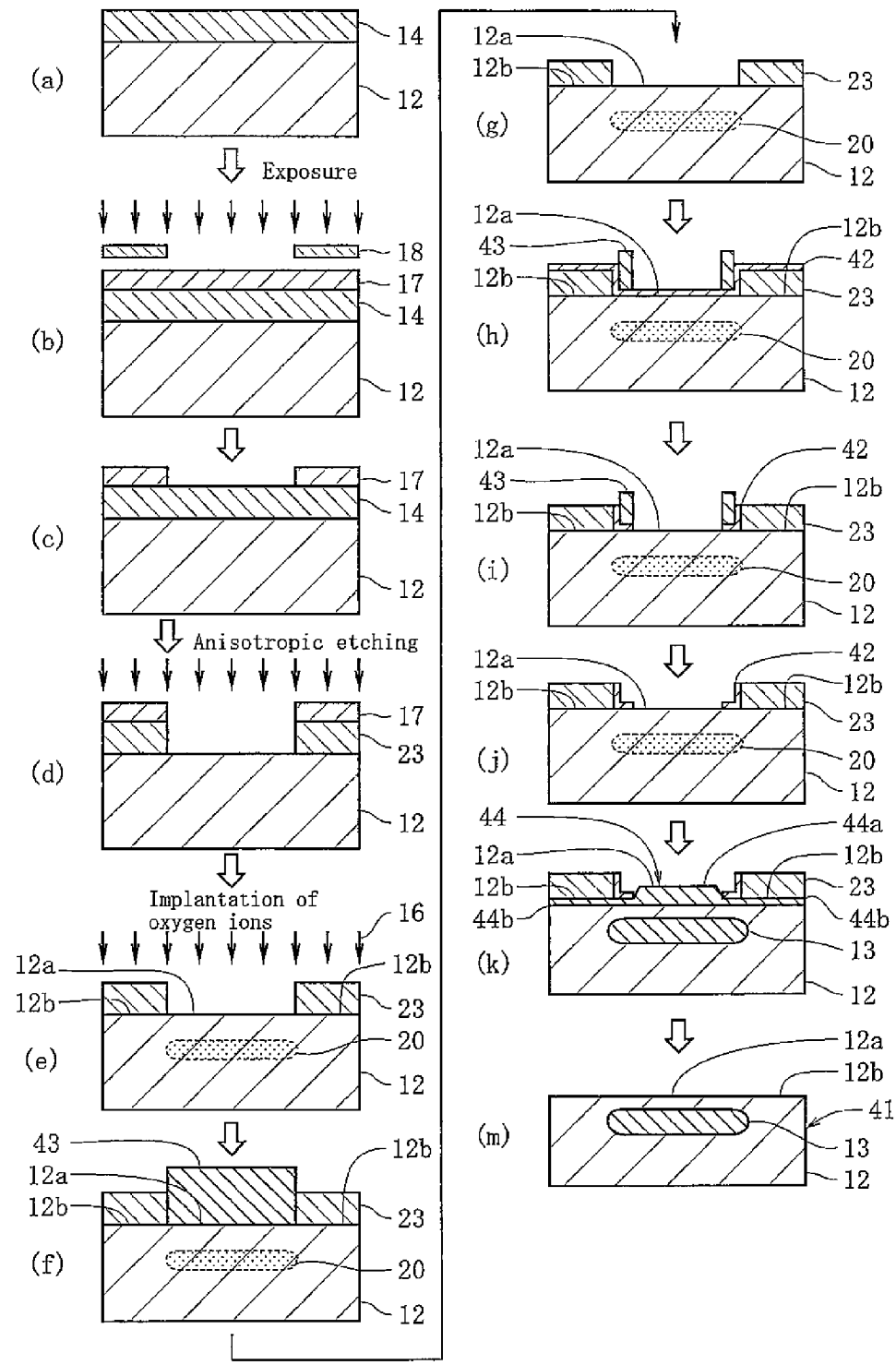
FIG. 3 is sectional view corresponding to FIG. 1, showing third embodiment of the present invention corresponding to FIG. 1.

FIG. 3 shows third embodiment of the present invention. In FIG. 3, a numeral same as that in FIG. 1 denotes the same component.

This embodiment further includes a step of etching a mask oxide film 23 to form a predetermined thickness and a step of forming a buffer film 42 on a predetermined-width boundary area contacting with the side of the mask oxide film 23 of silicon substrate surface 12a serving as an SOI area and on the side of the mask oxide film 23 between a step of implanting oxygen ions 16 and a step of performing annealing. Specifically, after implanting oxygen ions 16 (FIG. 3(e)), the mask oxide film 23 is decreased in thickness so that the difference between thicknesses of the oxide film 34a formed on the substrate surface 12a serving as an SOI area at the time of annealing to be described later and an oxide film 34b to be newly formed on the substrate surface 12b serving as a bulk area (thickness of the oxide film 34a minus thickness of the oxide film 34b) becomes 0.7 to 1.3 times, preferably 0.9 to 1.1 times of the thickness of a buried oxide film 13 to be described later Moreover, in this embodiment, FIGS. 3(f) and 3(g) shows a case of decreasing the mask oxide film 23 on the surface of a substrate 12 in thickness to form a thin mask oxide film 23. This decreasing the mask oxide film 23 in thickness is performed by anisotropically etching the above mask oxide film 23. The anisotropic etching of the above mask oxide film 23 is performed after forming a resist layer 43 on the substrate surface 12a serving as an SOI area on which the mask oxide film 23 is not formed (FIG. 3(f)). Formation of the resist layer 43 is performed in accordance with the same procedure as in the case of the resist layer 17.

Specifically, the resist layer 43 is formed on the entire surface of the substrate 12 on which the mask oxide film 23 is partially formed through photolithography, the resist layer 43 is exposed by using a not-illustrated photomask and developed and rinsed to remove the resist layer 43 formed on the mask oxide film 23 and leave the resist layer 43 on the substrate surface 12a serving as an SOI area on which the mask oxide film 23 is not formed. In this state, anisotropic etching is vertically applied to the surface of the substrate 12 by using the resist layer 43 as a mask to decrease the mask oxide film 23 in thickness. The anisotropic etching is reactive ion etching in this embodiment. In this case, the reason why the thickness of the mask oxide film 23 decreased in thickness is limited to the range of 0.7 to 1.3 times larger than the thickness of the buried oxide film 13 conforms to the same reason as the case of the second embodiment. After decreasing the mask oxide film 23 in thickness, the resist layer 23 is removed by a sulfuric acid/hydrogen peroxide solution or the like (FIG. 3(g)) to clean the mask oxide film 23. Incidentally, though in this embodiment anisotropic etching is used as means for decreasing a mask oxide film in thickness, it is also allowed to use isotropic etching such as wet etching as the above film-thickness decreasing means.

Then, the buffer film 32 made of silicon nitride is formed on the substrate surface 12a serving as an SOI area and the upside and the side of the mask oxide film 23. The thickness of the buffer film 32 ranges between 5 and 500 nm, preferably between 20 and 200 nm. The reason why the thickness of the buffer film 32 is limited to the range between 5 and 500 nm conforms to the same reason as the case of the above second embodiment. Incidentally, it is also allowed to form the buffer film of not silicon nitride but polysilicon or α silicon. In this state, a resist layer 46 is formed. The resist layer 46 is formed where a resist layer is formed on the entire surface of the substrate 12 on which the buffer film 42 is formed through photolithography, exposed by using a photomask, developed and rinsed; a resist layer formed on the mask oxide film 23 decreased in thickness and on the resist layer 43 formed at the central portion of the substrate surface 12a serving as an SOI area are removed and the resist layer 46 is left only on the predetermined-width boundary area contacting with the side of the mask oxide film 23 on the silicon substrate surface 12a serving as an SOI area. The predetermined width of the above boundary area is set to 0.1 to 5 µm, preferably to 0.2 to 1 µm. In this case, the width of the boundary area on which the resist layer 46 is left is limited to the range of 0.1 to 5 µm for the following reason: when the width is less than 0.1 µm, it is impossible to prevent oxygen from entering from the boundary area at the time of annealing and meanwhile, when the with exceeds 5 µm, dead space is increased in view of device design. As shown in FIG. 3(i), anisotropic etching is vertically applied to the surface of the substrate 12 by using the resist layer 46 as a mask to remove the buffer film 42 on the upside of the mask oxide film 23 decreased in thickness and on the buffer film 42 at the central portion of the substrate surface 12a serving as an SOI area. The anisotropic etching is reactive ion etching in this embodiment. Incidentally, it is allowed to remove the buffer film on the upside of the mask oxide film decreased in thickness and on the buffer film at the central portion of the substrate surface serving as an SOI area through isotropic etching such as wet etching instead of through anisotropic etching but. As a result, the boundary area on the silicon substrate surface 12a serving as an SOI area and the side of the mask oxide film 23 decreased in thickness are covered with the buffer film 42 (FIG. 3(j)).

In this state, the annealing where the substrate 12 is held in an oxidizing atmosphere in a temperature range between 1,300 and 1380° C. for 2 to 20 hours and slowly cooled is performed similarly to in the first embodiment (FIG. 3(k)). By this annealing, oxidation of the oxygen-ion area 20 into which oxygen ions 16 in the substrate 12 are implanted is accelerated and the buried oxide film 13 is formed inside the substrate 12. When forming the buried oxide film 13, only the substrate surface 12a serving as an SOI area corresponding to the oxygen-ion area 20 is lifted due to expansion of the above oxygen-ion area 20, that is thickness-directional expansion in the volume and thus a step occurs between the substrate surface 12a serving an SOI area on which the buried oxide film 13 is formed and the substrate surface 12b serving as a bulk area on which the buried oxide film 13 is not formed.

While this step is performed, because annealing is performed by horizontally setting the substrate 12 in a furnace, the surface of the substrate 12 is oxidized and an oxidized layer 44 is formed. Formation of the oxidized layer 44 is quickly progressed on the substrate surface 12a on which the mask oxide film 23 decreased in thickness is not formed, that is, on the substrate surface 12a serving as an SOI area on which the mask oxide film 23 decreased in thickness while it is slowly progressed on the substrate surface 12b serving as a bulk area on which the mask oxide film 23 decreased in thickness is formed, that is, on the substrate surface 12b serving as a bulk area on which the buried oxide film 13 is not formed. As a result, the oxidized layer 44 has the thick-layer portion 44a of the substrate surface 12a serving as an SOI area and the thin-layer portion 44b of the substrate surface 12b serving as a bulk area. Therefore, though the expansion in volume of oxygen-ion area 20 due to annealing causes the substrate surface 12a serving as an SOI area to be lifted and thus a step is formed between the substrate surface 12a serving as an SOI area and the substrate surface 12b serving as a bulk area, the step is absorbed by the difference between the thick-layer portion 44a and the thin-layer portion 44b of the oxidized layer 44 formed on the substrate 12. Moreover, when annealing the boundary area contacting with the mask oxide film 23 decreased in thickness of the substrate surface 12a serving as an SOI area and the side of the mask oxide film decreased in thickness while they are exposed without being covered with the buffer film 42, oxygen is supplied on the peripheral portion of the buried oxide film 13 from the upside and downside thereof as well as from the periphery of thereof and more oxygen is supplied to the peripheral portion of the buried oxide film 13 as compared to the central portion to which oxygen is supplied from only vertical direction so that oxidation is progressed to more extent than the central portion at the time of annealing. As a result, the thickness of the peripheral portion of the buried oxide film 13 is increased after annealing and there is a fear that the circumferential portion may be exposed on the substrate surface 12a. In this embodiment, however, because the boundary area contacting with the side of the mask oxide film 23 decreased in thickness of the substrate surface 12a serving as an SOI area and the side of the mask oxide film 23 decreased in thickness are covered with the buffer film 42, it is possible to prevent oxide from entering from the peripheral portion. This result in that it is possible to securely prevent the periphery of the buried oxide film 13 from being exposed on the surface of the substrate 12.

After forming the buried oxide film 13 through annealing, the above substrate 12 is immersed in an etching solution of thermal phosphoric acid, hydrofluoric acid or the like to remove the buffer film 42 and further immersed in a mixed solution (etching solution) of hydrofluoric-acid ammonium aqueous solution and hydrofluoric acid to remove the mask oxide film 23 decreased in thickness and the oxidized layer 44 newly formed on the surface of the substrate 12 at the time of annealing (FIG. 3(m)). Then, the buried oxide film 13 is expanded and the step formed on the surface of the substrate 12 is removed together with the thick-layer portion 44a of the oxidized layer 44 and when the thin-layer portion 44b of the oxidized layer 44 is removed, it is possible to set the step between the substrate surface 12a serving as an SOI area on which the buried oxide film 13 is formed and the substrate surface 12b serving as a bulk area on which the buried oxide film 13 is not formed to 0 to 30 nm. By using the SOI substrate 41, it is possible to solve a trouble that a focus is shifted in the photolithography step.

Fourth Embodiment

Figure 4:
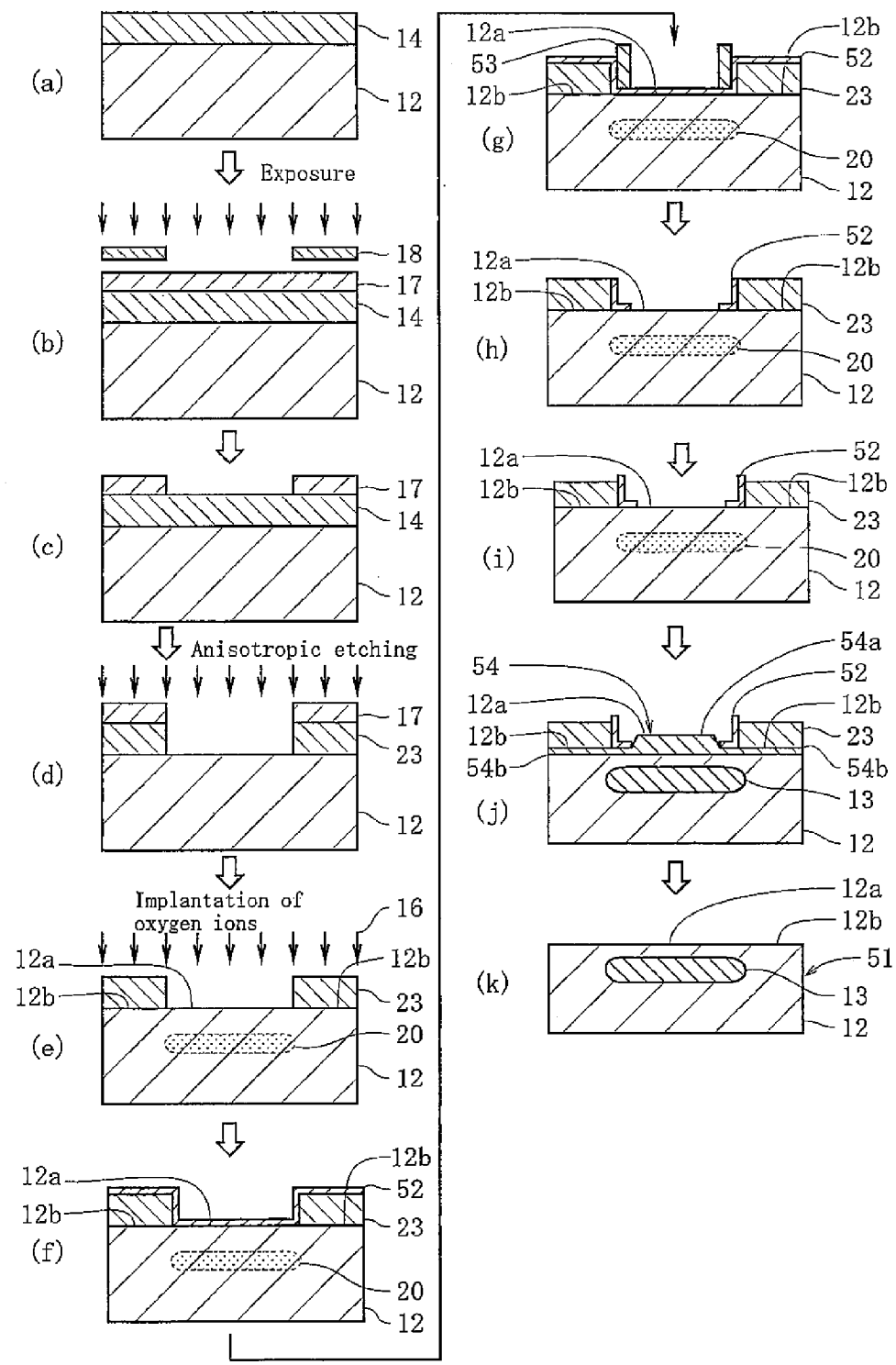
FIG. 4 is sectional view corresponding to FIG. 1, showing fourth embodiment of the present invention.

FIG. 4 shows fourth embodiment of the present invention. In FIG. 4, a numeral same as that in FIG. 1 denotes the same component.

This embodiment further includes a step of forming a buffer film 52 on a predetermined-width boundary area contacting with the side of a mask oxide film 23 of silicon substrate surface 12a serving as an SOI area and the side of the mask oxide film 23 and a step of etching the mask oxide film 23 to a predetermined thickness between a step of implanting oxygen ions 16 and a step of performing annealing. Specifically, after implanting oxygen ions 16 (FIG. 4e), the buffer film 52 made of silicon nitride is formed on substrate surface 12a serving as an SOI area and the upside and on the side of the mask oxide film 23. The thickness of a buffer film 52 ranges between 5 and 500 nm, preferably between 20 and 200 nm. This limitation of the thickness of the buffer film 52 is restricted in the range between 5 and 500 nm conforms to the reason same as in the above second embodiment 2. Incidentally, it is also allowed to form a buffer film of polysilicon or α silicon instead of silicon nitride. In this state, the resist layer 53 is formed. A resist layer 53 is formed where a resist layer is formed on the entire surface of the substrate 12 on which the buffer film 52 is formed through photolithography, exposed by using a photomask, developed and rinsed and the resist layer formed on the mask oxide film 23 and the resist layer 43 formed at the central portion of the substrate surface 12a serving as an SOI area are removed, and the resist layer 53 is left only on a predetermined-width boundary area contacting with the side of the mask oxide film 23 on the silicon substrate surface 12a serving as an SOI area. A predetermined width of a boundary area is set to the range between 0.1 to 5 μm, preferably between 0.2 and 1 μm. This limitation of the width of the boundary area for leaving the resist layer 53 in the range of 0.1 to 5 μm conforms to the reason that the width is the same as in the width of a boundary area for leaving the resist layer of the third embodiment. As shown in FIG. 4(g), anisotropic etching is vertically applied to the surface of the substrate 12 by using the resist layer 53 as a mask to remove the buffer film 52 on the upside of the mask oxide film 23 and the buffer film 52 at the central portion of the substrate surface 12a serving as an SOI area. The anisotropic etching is reactive ion etching in this embodiment. Incidentally, it is also allowed to remove a buffer film on the upside of the mask oxide film and a buffer film at the central portion of the substrate surface serving as an SOI area by isotropic etching such as wet etching, not anisotropic etching. As a result, the boundary area of silicon substrate surface 12a serving as an SOI area and the side of the mask oxide film 23 are covered with the buffer film 52 (FIG. 4(h)).

In this state, the mask oxide film 23 is decreased in thickness to form a thickness 0.7 to 1.3 times, preferably 0.9 to 1.1 times of the thickness of the buried oxide film 13. Then, this embodiment shows a case of decreasing the thickness of the mask oxide film 23 on the surface of the substrate 12 to form a thin mask oxide film 23 as shown in FIG. 4 where the mask oxide film 23 is decreased in thickness by wet-etching (isotropic-etching). Specifically, the substrate 12 is immersed in a hydrofluoric-acid aqueous solution to decrease the mask oxide film 23 in thickness. In this case, because the side of the mask oxide film 23 is covered with the buffer film 52, it is possible to limit the etching of the side of the mask oxide film 23. The mask oxide film 23 is decreased in thickness and then cleaned. Incidentally, though this embodiment uses wet etching (isotropic etching) as means for decreasing a mask oxide film in thickness, it is also allowed to use anisotropic etching such as reactive etching as the above film-thickness decreasing means.

In this state, annealing where the substrate 12 is held in an oxidizing atmosphere in a temperature range of 1,300 to 1380° C. for 2 to 20 hours and then slowly cooled is performed similarly to the case of the first embodiment (FIG. 4(j)). By this annealing, oxidation of the oxygen ion area 20 into which oxygen ions 16 are implanted in the substrate 12 is accelerated and the buried oxide film 13 is formed inside the substrate 12. When forming the buried oxide film 13, only the substrate surface 12a serving as an SOI area is lifted due to volume expansion of the above oxygen ion area 20, that is the thickness-directional expansion of the oxygen ion area 20 as shown in FIG. 4(j), a step is produced between the substrate surface 12a serving as an SOI area on which the buried oxide film 13 is formed and the substrate surface 12b serving as a bulk area on which the buried oxide film 13 is not formed.

While the above step is performed, because annealing is performed by horizontally setting the substrate 12 in a furnace, the surface of the substrate 12 is oxidized and the oxidized layer 54 is formed. Formation of the oxidized layer 54 is quickly progressed on the substrate surface 12a on which the mask oxide film 23 is not formed, that is, the substrate surface 12a serving an SOI area on which the buried oxide film 13 is formed while it is slowly progressed on the substrate surface 12b on which the oxide film 23 decreased in thickness is formed, that is, the substrate surface 12b serving as a bulk area on which the buried oxide film 13 is not formed. As a result, the oxidized layer 54 in a state where the buried oxide film 13 is formed has a thick-layer portion 54a of the substrate surface 12a serving as an SOI area and a thin-layer portion 54b of the substrate surface 12b serving as a bulk area. Therefore, though the expansion in volume of the oxygen ion area 20 due to annealing causes the substrate surface 12a serving as an SOI area to be lifted and a step is produced between the substrate surface 12a serving as an SOI area and the substrate surface 12b serving as a bulk area, the step is absorbed by the difference between the thick-layer portion 54a and the thin-layer portion 54b of the oxidized layer 54 formed on the substrate 12. Moreover, when annealing the boundary area contacting with the side of the mask oxide film 23 decreased in thickness on the substrate surface 12a serving as an SOI area and the side of the mask oxide film 23 decreased in thickness while the boundary area and the side are exposed without being covered by the buffer film 52, oxygen is supplied to the peripheral portion of the buried oxide film 13 from the upside and downside of the peripheral portion as well as from oxygen is also supplied from the periphery. Therefore, more oxygen is supplied to the peripheral portion of the buried oxide film 13 as compared to the case of the central portion to which oxygen is supplied only from vertical direction, oxidation is progressed to more extent than the central portion, the peripheral portion of the buried oxide film 13 after annealed is further increased in thickness as compared to the central portion, and there is a fear that the peripheral portion may be exposed on the substrate surface 12a. In this embodiment, however, the boundary area contacting with the side of the mask oxide film 23 decreased in thickness on the substrate surface 12a serving as an SOI area and on the side of the mask oxide film 23 decreased in thickness are covered with the buffer film 52 so that the side of the mask oxide film 23 is not etched even if isotropic etching easier than anisotropic etching for decrease of the mask oxide film 23 in thickness without using a resist layer is used. Therefore, it is possible to prevent oxygen from entering from the boundary area. As a result, it is possible to securely prevent the periphery of the buried oxide film 13 from being exposed on the surface of the substrate 12.

After forming the buried oxide film 13 through annealing, the above substrate 12 is immersed in an etching solution of thermal phosphoric acid, hydrofluoric acid or the like to remove the buffer film 52, and further immersed in a mixed solution (etching solution) of hydrofluoric acid to remove the mask oxide film 23 decreased in thickness and the oxidized layer 54 newly formed on the surface of the substrate 12 at the time of annealing (FIG. 4(k)). Thereby the step formed on the surface of the substrate 12 when the buried oxide film 13 is expanded is removed together with the thick-layer portion 54a of the oxidized layer 54 and when the thin-layer portion 54b of the oxidized layer 54 is removed, it is possible to set the step between the substrate surface 12a serving as an SOI area on which the buried oxide film 13 is formed and the substrate surface 12b serving as a bulk area on which the buried oxide film 13 is not formed to 0 to 30 nm. By using an SOI substrate 51, it is possible to solve the problem that a focus is shifted in the photolithography step.

Fifth Embodiment

Figure 5:
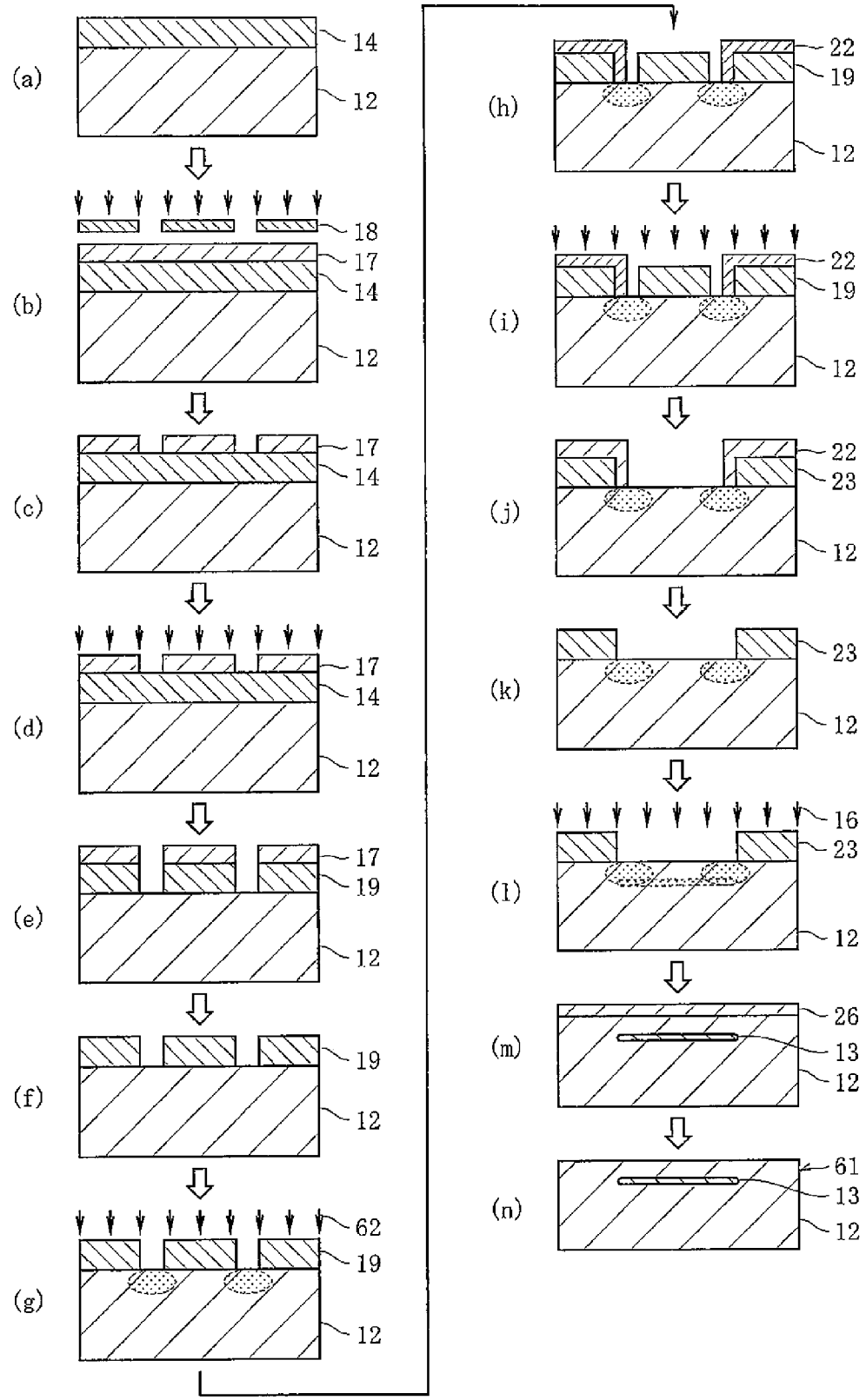
FIG. 5 is sectional view corresponding to FIG. 1, showing fifth embodiment of the present invention.

FIG. 5 show fifth embodiment of the present invention. As shown in FIG. 5, the SOI substrate 61 has a silicon substrate 12 and a buried oxide film 13 formed inside the substrate 12. The substrate 12 is cut in a sliced form along the plane perpendicular to the axis of a single-crystal silicon rod grown through the Czochralski (CZ) method "plane (100) of crystal structure of single crystal silicon". A buried oxide film 13 is formed as described below. Incidentally, it is allowed to cut a substrate from a single-crystal silicon rod or single-crystal silicon plate grown in accordance with the floating zone (FZ) method instead of the CZ method.

Firstly, a surface oxide film 14 is formed on the surface of the substrate 12 (FIG. 5(a)). The surface oxide film 14 is a silicon oxide film ($SiO_2$ film) which is formed by thermally oxidizing the substrate 12 or with the CVD method (chemical vapor deposition method). The thickness of the surface oxide film 14 is formed in the range between 200 and 1,000 nm, preferably between 500 and 800 nm. this limitation of thickness of the surface oxide film 14 in the range between 200 and 1,000 nm is for the following reason: there is a fear that oxygen ions 16 to be described later pass through the surface oxide film 14 and may be implanted into the substrate 12 when the thickness is less than 200 nm meanwhile it is possible to sufficiently cut off oxygen ions 16 when the thickness is 1,000 nm or less. Then, a resist layer 17 having a predetermined pattern is formed on the surface of the surface oxide film 14 through photolithography (FIGS. 5(b) and 5(c)). The resist layer 17 is exposed by using a photomask 18 (FIG. 5(b)) and developed and rinsed, and a predetermined pattern is formed on the resist layer 17 (FIG. 5(c)). In the resist layer 17, a portion corresponding to the periphery of a buried oxide film 13 to be obtained is exposed and thereby a portion corresponding to the periphery of the buried oxide film 13 to be obtained is removed.

Anisotropic etching is applied to the surface oxide film 14 vertically to the surface of the substrate 12 by using the above resist layer 17 as a mask (FIGS. 5(d) and 5(e)). The anisotropic etching is reactive ion etching in this embodiment. In the reactive ion etching, though not illustrated, by mounting a substrate on the lower electrode of two opposite electrodes set in a reactive chamber, applying a high-frequency voltage to these electrodes to induce plasma, a radical ion species having reactivity higher than such etching gas as $CF_4$ or $SF_6$ is formed, the radical ions of several tens to several hundreds of keV enter the substrate 12 by the self-bias potential difference produced between plasma and substrate 12, and etching of the surface oxide film 14 is progressed by the both effects of sputtering action and chemical reaction due to the radical ions. Therefore, the inner margin of the surface oxide film 14 becomes a vertical etching shape free from undercut. Incidentally, as the anisotropic etching, it is allowed to use ECR plasma etching. After the etching is completed, the resist layer 17 is removed by a sulfuric acid/hydrogen peroxide solution or the like to partially form a contour oxide film 19 constituted of the surface oxide film 14 left on the surface of the substrate without being etched and having a thickness of 200 to 1,000 nm on the surface of the substrate 12 (FIG. 5(f)) and to clean the oxide film 19. In the resist layer 17, because the portion corresponding to the periphery of the buried oxide film 13 to be obtained is removed through exposure, only the portion in surface oxide film 14 corresponding to the periphery of the buried oxide film 13 to be obtained is etched and thus the portion of the contour oxide film 19 left on the surface of the substrate, corresponding to the periphery of the buried oxide film 13 to be obtained is opened.

Then, silicon ions 62 are implanted into the surface of the substrate 12 by using the contour oxide film 19 as a mask (FIG. 5(g)). In this case, for implanting conditions of silicon ions 62 implantation quantity ranges between $1\times10^{15}/cm^2$ to $1\times10^{18}/cm^2$, preferably $1\times10^{16}/cm^2$ to $1\times10^{17}/cm^2$ and implantation energy ranges between 40 and 240 keV, preferably between 100 and 240 keV.

Then, the resist layer 22 is formed on the surface of a portion of the contour oxide film 19 not corresponding to the buried oxide film 13 to be obtained through photolithography (FIGS. 5(h) and 5(i)). Specifically, the resist layer 22 formed on the whole contour oxide film 19 is exposed by using a not-illustrated photomask; a portion corresponding to the buried oxide film 13 to be obtained is exposed and to be removed; and the resist layer 22 is left on the surface of a portion not corresponding to the buried oxide film 13 to be obtained. Then, the contour oxide film 19 is etched by using the resist layer 22 as a mask (FIGS. 5(i) and 5(j)). Thereafter, the resist layer 22 is removed by a sulfuric acid/hydrogen peroxide solution or the like (FIGS. 5(j) and 5)(k) to partially form the mask oxide film 73 constituted of the contour oxide film 19 left on the substrate surface without being etched on the surface of the substrate 12 (FIG. 5(k)). In this case, because the resist layer 22 is formed on the surface of a portion not corresponding to the buried oxide film 13 to be obtained, a portion of the mask oxide film 73 corresponding to the buried oxide film 13 to be obtained is opened. Moreover, because detailed means for formation of the resist layer 22 and for etching of the contour oxide film 19 is the same as in the above-described formation of the resist layer 17 and etching of the surface oxide film 14, repetitive description is omitted.

Then, oxygen ions 16 are implanted into the surface of the substrate 12 by using the mask oxide film 73 as a mask (FIG. 5(l)). In this case, for implanting conditions of oxygen ions 16, implantation quantity ranges between $1 \times 10^{17}/cm^2$ and $2 \times 10^{18}/cm^2$, preferably between $2 \times 10^{17}/cm^2$ and $5 \times 10^{17}/cm^2$ and implantation energy ranges between 20 and 200 keV, preferably between 60 and 180 keV. After implanting oxygen ions 16, the mask oxide film 73 is removed from the surface of the substrate 12 through wet etching to perform the annealing where the substrate 12 is in a oxidizing atmosphere in a temperature in the range between 1,300 and 1,380° C. for 2 to 20 hours and slowly cooled (FIG. 5(m)). An oxidizing atmosphere contains a mixed gas atmosphere of inert gas and oxygen and is exemplified by a mixed-gas atmosphere of argon and oxygen or mixed gas atmosphere of nitrogen and oxygen. The oxidizing atmosphere in this case contains 100 vol % of oxygen. Preferable content of oxygen ranges between 0.5 and 90 vol % and more preferable content ranges between 40 and 70 vol %. When the oxygen content is less than 0.5%, oxidation of the surface of the substrate 12 cannot be expected at the time of annealing to be described later.

Oxidation of a portion to which the oxygen ions 16 are implanted of the substrate 12 is accelerated by the above annealing and the buried oxide film 13 is formed inside the substrate 12. At the same time, an annealed oxidized layer 26 is formed on the surface of the substrate 12. When, after forming the buried oxide film 13 by the above annealing, the above substrate 12 is immersed in a mixed solution (etching solution) of hydrofluoric-acid ammonium aqueous solution and hydrofluoric acid to remove the oxidized layer 26 (FIG. 5(n)), the SOI substrate 61 in which the buried oxide film 13 is formed inside the substrate 12 is obtained.

In this method for manufacturing an SOI substrate, since silicon ions 62 are implanted into the surface of the silicon substrate 12 corresponding to the periphery of the buried oxide film 13 to be obtained before implanting oxygen ions, the silicon ion inhibits oxidation at the periphery of the buried oxide film 13 at the time of subsequent annealing so that it is possible to avoid the state that the thickness is further increased as compared to that of other portion. As a result, it is possible to prevent the edge area of the buried oxide film 13 from being exposed on the surface of the substrate 13 due to the expansion in volume of the periphery of the buried oxide film 13.

Sixth Embodiment

Figure 6:
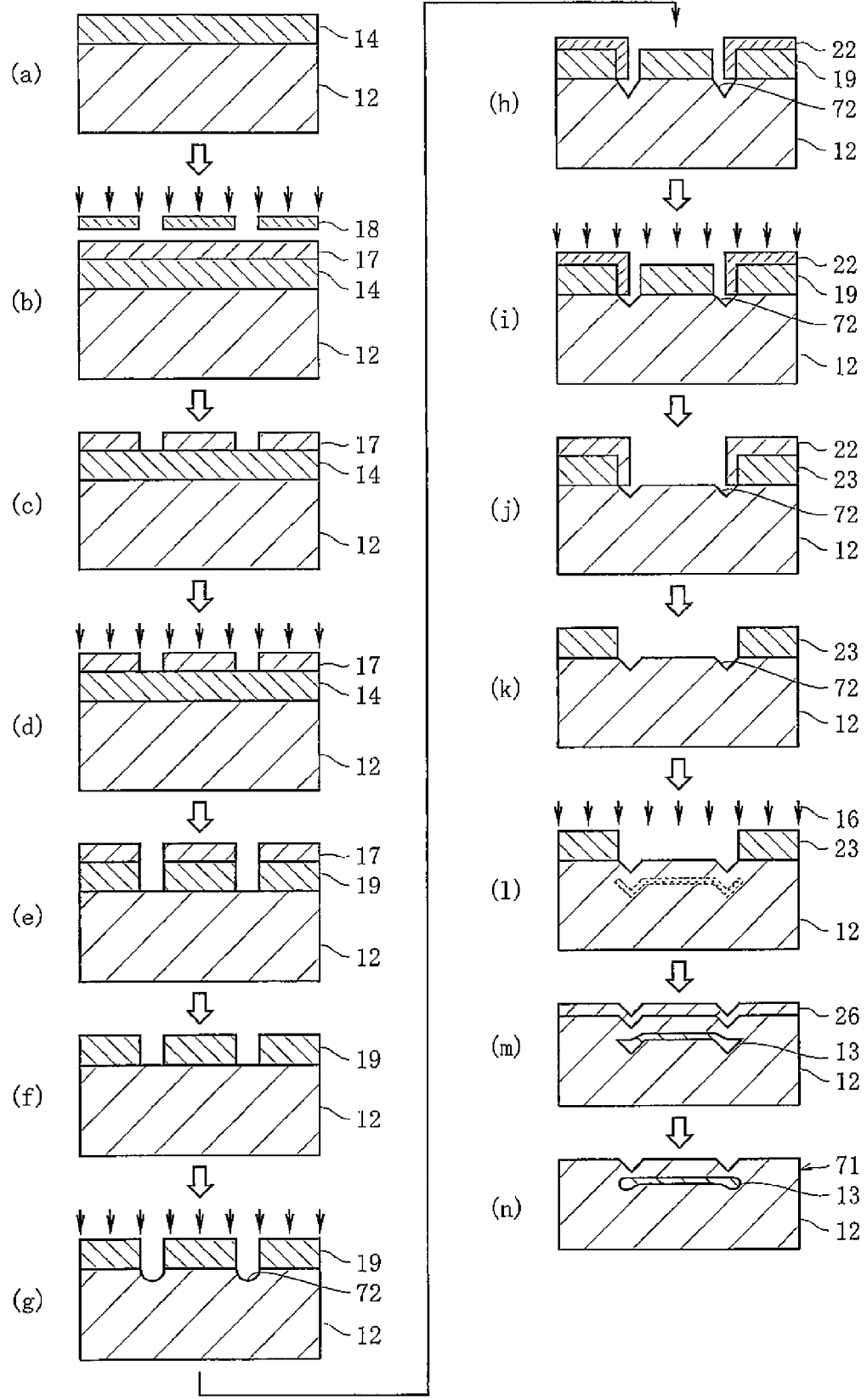
FIG. 6 is sectional view corresponding to FIG. 1, showing sixth embodiment of the present invention.

FIG. 6 shows sixth embodiment of the present invention. In FIG. 6, a numeral same as that in FIG. 5 denotes the same component and thus repetitive description is omitted.

As shown in FIG. 6, the method of this embodiment in characterized in further including a step of forming a concave groove 72 on the surface of a silicon substrate 12 corresponding to the periphery of the buried oxide film 13 to be obtained before forming a mask oxide film 73 or between a step of forming the mask oxide film 73 and a step of implanting oxygen ions 16. More particularly, a silicon substrate is prepared similarly to the case of the previous embodiment to form a surface oxide film 14 on the surface of the substrate 12 (FIG. 6(a)). Then, a resist layer 17 having a predetermined pattern is formed on the surface of a surface oxide film 14 through photolithography (FIGS. 6(b) and 6(c)) to anisotropically etching the surface oxide film 14 vertically to the surface of the substrate 12 by using a resist layer 17 as a mask (FIGS. 6(d) and 6(e)). After the etching is completed, the resist layer 17 is removed by a sulfuric acid/hydrogen peroxide solution or the like and a contour oxide film 19 constituted of the surface oxide film 14 left on the substrate surface without being etched is partially formed on the surface of the substrate 12 (FIG. 6(f)) and then cleaned. In this case, the contour oxide film 19 is a film in which a portion corresponding to the periphery of a buried oxide film 13 to be obtained is opened.

Then, the surface of the substrate 12 on which the contour oxide film 19 is not formed is lowered by a predetermined value to form a concave groove 72 through Si etching. Though the Si etching for forming the concave groove 72 is exemplified by a dry etching method such as a reactive ion etching method or chemical dry etching method or wet etching method can be used, the dry etching method is preferable which can accurately form the concave groove 72 on the surface of the substrate 12 serving as an SOI area. It is preferable that the depth of the concave groove 72 is formed into a predetermined thickness in the range between 50 and 500 nm and it is more preferable that the depth ranges between 100 and 300 nm. This limitation of the depth of the concave groove 72 in the range between 50 and 500 nm is because an area serving as a dead space on the design of a device is increased when the depth of the concave groove 72 is less than 50 nm and because the periphery of the buried oxide film 13 is not formed at a position far from the surface of the substrate 12 when the depth of the concave groove 72 exceeds 500 nm.

Thereafter, a resist layer 22 is formed on the surface of a portion not corresponding to the buried oxide film 13 to be obtained of a contour oxide film 19 through photolithography (FIGS. 6(h) and 6(i)) to etch the contour oxide film 19 by using the resist layer 22 as a mask (FIGS. 6(i) and 6(j)). Thereafter, the resist layer 22 is removed by a sulfuric acid/ hydrogen peroxide solution or the like (FIGS. 6(j) and 6(k)) to partially form a mask oxide film 73 constituted of the contour oxide film 19 left on the substrate surface without being etched on the surface of the substrate 12 (FIG. 6(k)). Then, by using the mask oxide film 73 as a mask, oxygen ions 16 are implanted into the surface of the substrate 12 (FIG. 6(l)). After implanting oxygen ions 16, the mask oxide film 73 is removed from the surface of the substrate 12 through wet etching to perform the annealing where the substrate 12 is held in an oxidizing atmosphere in a temperature range between 1,300 and 1,380° C. for 2 to 20 hours and then slowly cooled (FIG. 6(m)). Oxidation of the portion to which oxygen ions 16 of the substrate 12 are implanted is accelerated by the annealing and a buried oxide film 13 is formed inside the substrate 12. At the same time, an oxidized layer 26 is formed by the annealing on the surface of the substrate 12. After forming a buried oxide film 13 through the above annealing, the substrate 12 is immersed in a mixed solution (etching solution) of hydrofluoric-acid ammonium aqueous solution and hydrofluoric acid to remove an oxidized layer 26 (FIG. 6(n)). Thereby, an SOI substrate 71 on which a buried oxide film 13 is formed inside the substrate 12 is obtained.

In the method of the sixth embodiment, a concave groove 72 is formed on the surface of the silicon substrate 12 corresponding to the periphery of the buried oxide film 13 to be obtained before implanting oxygen ions 16. Therefore, the periphery of the buried oxide film 13 obtained through implantation of oxygen ions 16 is kept at a distance the surface of the substrate 12 along the concave groove 72 (FIG. 6(*l*)). Therefore, even if the thickness at the periphery of the buried oxide film is further increased than other portion at the time of subsequent annealing (FIG. 6(*n*)), the edge area at the periphery of the buried oxide film 13 does not reach nor is exposed on the surface of the substrate 12. Therefore it is possible to effectively prevent the edge area from being exposed on the surface of the substrate 12.

Seventh Embodiment

Figure 7:
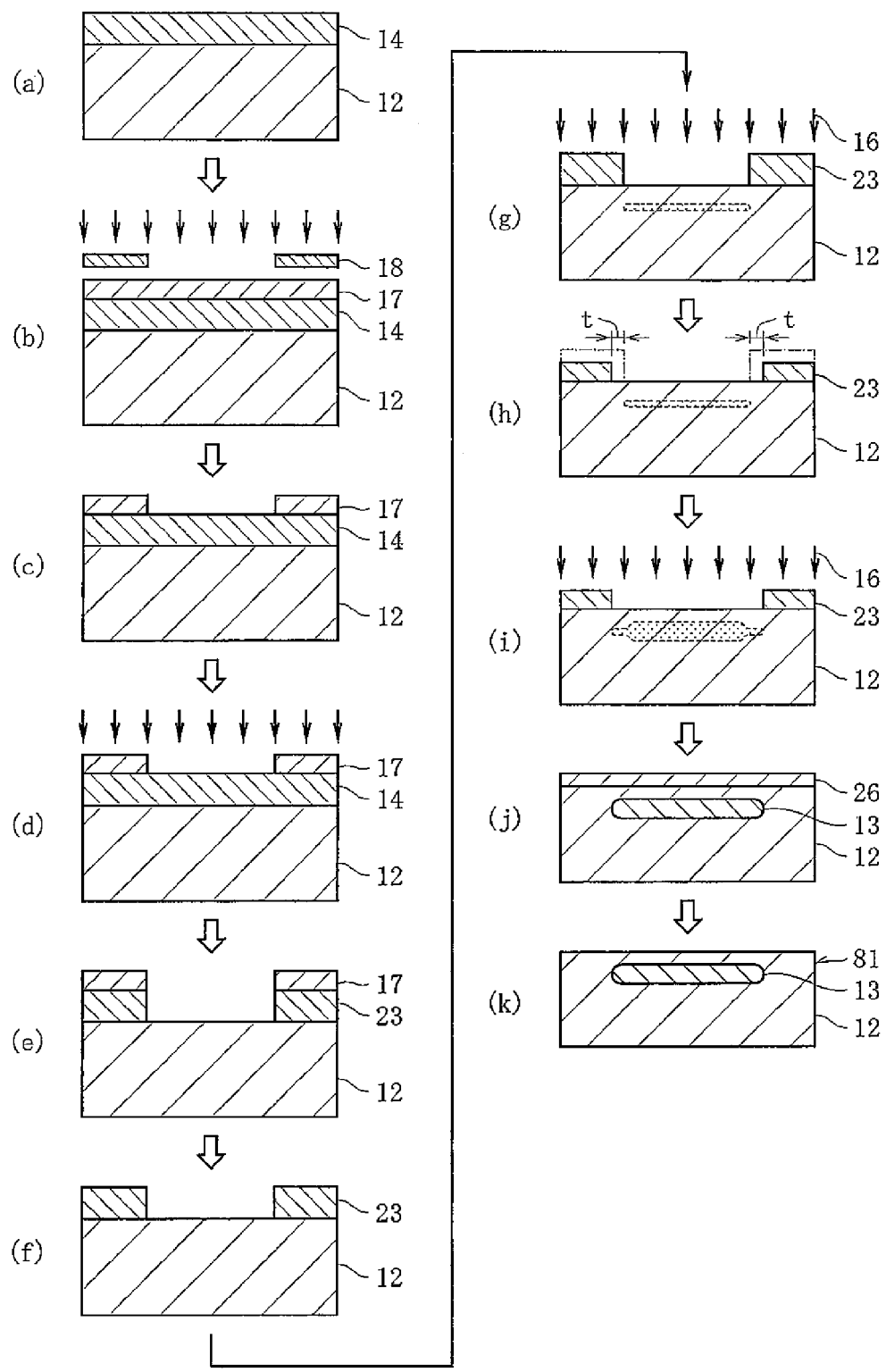
FIG. 7 is sectional view corresponding to FIG. 1, showing seventh embodiment of the present invention.

FIG. 7 shows seventh embodiment of the present invention. In FIG. 7, a numeral same as that of the above embodiments denotes the same component and repetitive description is omitted.

As shown in FIG. 7, in the method of this embodiment, it is characterized in that implantation of oxygen ions 16 is performed a plurality of times separately and further includes an etching step of etching the margin of the mask oxide film 73 between precedent oxygen-ion implanting step and subsequent oxygen-ion implanting step.

That is, a silicon substrate is prepared similarly to the case of the above embodiments to form a surface oxide film 14 on the surface of the substrate 12 (FIG. 7(*a*)). Then, a resist layer 17 having a predetermined pattern is formed on the surface of the surface oxide film 14 through photolithography (FIGS. 7(*b*) and 7(*c*)). Anisotropic etching is applied to the surface oxide film 14 vertically to the surface of the substrate 12 by using the resist layer 17 as a mask (FIGS. 7(*d*) and 7(*e*)). After the etching is completed, the resist layer 17 is removed by a sulfuric acid/hydrogen peroxide solution or the like to partially form a mask oxide film 73 constituted of the surface oxide film 14 left on the substrate surface without being etched on the surface of the substrate 12 (FIG. 7(*f*)). Then, oxygen ions 16 are implanted to the surface of the substrate 12 by using the mask oxide film 73 as a mask. This Implantation of the oxygen ions 16 is performed a plurality of times separately.

That is, when the final implantation quantity of oxygen ions 16 ranges between $1 \times 10^{17}/cm^2$ and $2 \times 10^{18}/cm^2$, implantation of oxygen ions at $2.5 \times 10^{16}/cm^2$ to $5 \times 10^{17}/cm^2$ is performed two to four times. FIG. 7 shows that implantation is performed twice (FIGS. 7(*g*) and 7(*i*)). Then, the implantation energy at that time ranges between 20 and 200 keV, preferably ranges between 60 and 180 keV. Then, an etching step (Fig. (FIG. 7(*h*)) of etching the margin of the mask oxide film 73 is included between the precedent oxygen-ion implanting step (FIG. 7(*g*)) and the subsequent oxygen-ion implanting step (FIG. 7(*i*)). Though the etching of the margin is exemplified by dry etching method such as the reactive etching method or chemical dry etching or by wet etching method, the dry etching for accurately etching the margin of the mask oxide film 73 is preferable. It is preferable that the margin t of the mask oxide film 73 pared by the etching ranges between 10 and 500 nm, preferably between 50 and 200 nm. When the margin t of the mask oxide film 73 is less than 10 nm, a trouble occurs that the periphery of the buried oxide film 13 does not become thin. Meanwhile, when the margin t of the mask oxide film 73 to be pared exceeds 500 nm, the shielding effect of oxygen ions is eliminated from the mask oxide film 73 and there is a disadvantage that oxygen ions are implanted to the substrate 12 covered with the mask oxide film 73.

After implantation of oxygen ions 16 is performed before and after the etching step (FIG. 7(*h*)) a plurality of times separately (FIGS. 7(*g*) and 7(*i*)), the mask oxide film 73 is removed from the surface of the substrate 12 through wet etching to perform the annealing where the substrate 12 is held in an oxidizing atmosphere in the temperature range between 1,300 and 1380° C. for 2 to 20 hours and then slowly cooled (FIG. 7(*j*)). Oxidation of a portion into which oxygen ions are implanted of the substrate 12 by the annealing is accelerated and the buried oxide film 13 is formed inside the substrate 12. At the same time, the oxidized layer 26 by annealing is formed on the surface of the substrate 12. After forming the buried oxide film 13 through the above annealing, the substrate 12 is immersed in a mixed solution (etching solution) of hydrofluoric-acid ammonium aqueous solution and hydrofluoric acid to remove the oxidized layer 26 (FIG. 7(*k*)). As a result, an SOI substrate 81 on which the buried oxide film 13 is formed inside the substrate 12 is obtained.

In the method of the seventh embodiment, the margin of the mask oxide film 73 is decreased by etching the margin while oxygen ions 16 are implanted a plurality of times. Therefore, the periphery corresponding to the decreased mask oxide film 73 of the buried oxide film 13 to be obtained through a plurality of times of implantation of oxygen ions 16 becomes thin as compared to other portion. Therefore, even if the thickness at the periphery of the buried oxide film 13 is further increased as compared to other portion at the time of subsequent annealing, the thickness becomes uniform with that of other portion because the thickness is thinner before annealing, the edge area at the periphery of the buried oxide film 13 does not reach the surface of the substrate 12, and thus it is possible to prevent the edge area of the buried oxide film 13 from being exposed on the surface of the substrate 12.

Eighth Embodiment

Figure 8:
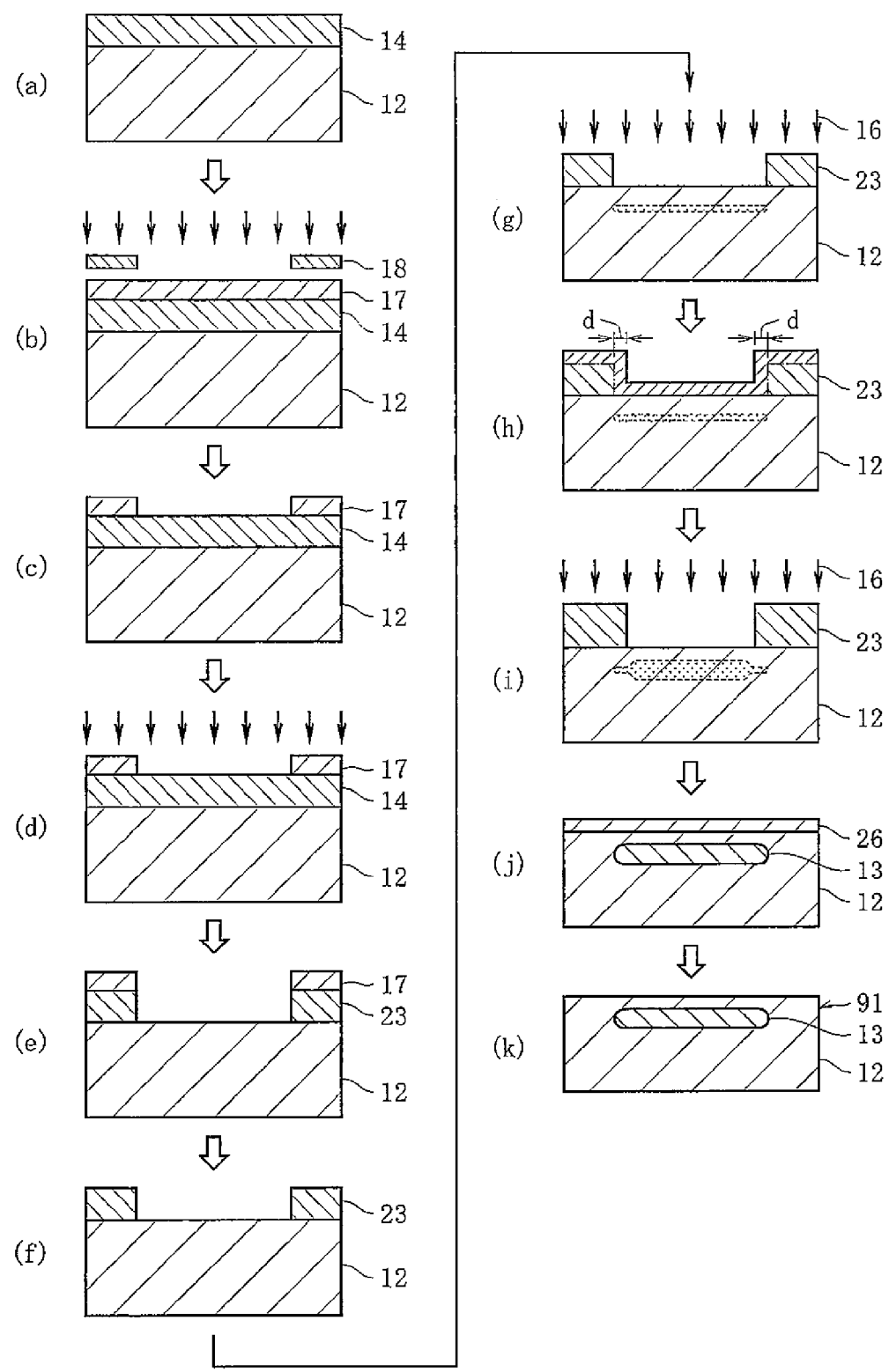
FIG. 8 is sectional view corresponding to FIG. 1 showing eighth embodiment of the present invention.

FIG. 8 shows eighth embodiment of the present invention. In FIG. 8, a numeral same as that in the above embodiments denotes the same component and thus repetitive description is omitted.

As shown in FIG. 8, in the method of this embodiment, it is characterized that implantation of oxygen ions 16 is performed a plurality of times separately and a margin expanding step of expanding the margin of the mask oxide film 73 is further included between the precedent oxygen-ion implanting step and the subsequent oxygen-ion implanting step.

More particularly, firstly, a silicon substrate is prepared similarly to the precedent embodiments to form a surface oxide film 14 on the surface of the substrate 12 (FIG. 8(*a*)). Secondly, a resist layer 17 having a predetermined-pattern is formed on the surface of the surface oxide film 14 through photolithography (FIGS. 8(*b*) and 8(*c*)) to apply anisotropic etching to the surface oxide film 14 vertically to the surface of the substrate 12 by using the resist layer 17 as a mask (FIGS. 8(*d*) and 8(*e*)). After the etching is completed, the resist layer 17 is removed by a sulfuric acid/hydrogen peroxide solution or the like to partially form a mask oxide film 73 constituted of the surface oxide film 14 left on the substrate surface without being etched on the surface of the substrate 12 (FIG. 8(*f*)). Thirdly, oxygen ions 16 are implanted into the surface of the substrate 12 by using the mask oxide film 73 as a mask. This implantation of oxygen ions 16 is performed a plurality of times separately (FIGS. 8(*g*) and 8(*i*)). Because implantation of oxygen ions 16 performed a plurality of times separately is the same as in the above-described third embodiment, repetitive description is omitted.

Then, a margin expanding step (FIG. 8(h)) of expanding the margin of the mask oxide film 73 is set between the precedent oxygen-ion implanting step (FIG. 8(g)) and the subsequent oxygen-ion implanting step (FIG. 8(i)). Expansion of the margin of the mask oxide film 73 is performed by patterning a CVD-SiO$_2$ film. It is preferable that the margin d of the mask oxide film 73 is expanded in the range between 10 and 500 nm by the margin expanding step and it is more preferable that the margin d is expanded in the range between 50 and 200 nm. When expansion of the margin d is less than 10 nm, a trouble occurs that the periphery of the buried oxide film 13 does not become thin and when expansion of the margin exceeds 500 nm, an area serving as a dead space is increased in device design.

After oxygen ions 16 are implanted separately a plurality of times (FIGS. 8(g) and 8(i)) before and after the margin expanding step (FIG. 8(h)), the mask oxide film 73 is removed from the surface of the substrate 12 through wet etching and then, the annealing is performed where the substrate 12 is held in an oxidizing atmosphere in a temperature range between 1,300 and 1,380° C. for 2 to 20 hours and slowing cooled (FIG. 8(j)). Oxidation of a portion to in which oxygen ions 16 are implanted of the substrate 12 is accelerated by the annealing and the buried oxide film 13 is formed inside the substrate 12. At the same time, the oxidized layer 26 by annealing is formed on the surface of the substrate 12. After forming the buried oxide film 13 through the above annealing, the substrate 12 is immersed in a mixed solution (etching solution) of hydrofluoric-acid ammonium aqueous solution and hydrofluoric acid to remove the oxidized layer 26 (FIG. 8(k)). As a result, an SOI substrate 91 in which the buried oxide film 13 is formed inside the substrate 12 is obtained.

In the method of the eighth embodiment while oxygen ions 16 are implanted separately a plurality of times, the mask oxide film 73 is expanded by applying overlay to the periphery of the film 73. Therefore, a portion corresponding to the expanded periphery of the buried oxide film 13 obtained through implantation of oxygen ions 16 a plurality of times becomes thinner than other portion of the buried oxide film 13. Therefore, even if the thickness at the periphery of the buried oxide film 13 is further increased than other portion at the time of subsequent annealing, the thickness becomes uniform with the thickness of other portion because the above thickness is thinner before annealing, the edge area at the periphery of the buried oxide film 13 does not reach the surface of the substrate 12, and thus it is possible to effectively prevent the edge area of the buried oxide film 13 from being exposed on the surface of the substrate 12.

Ninth Embodiment

Figure 9:
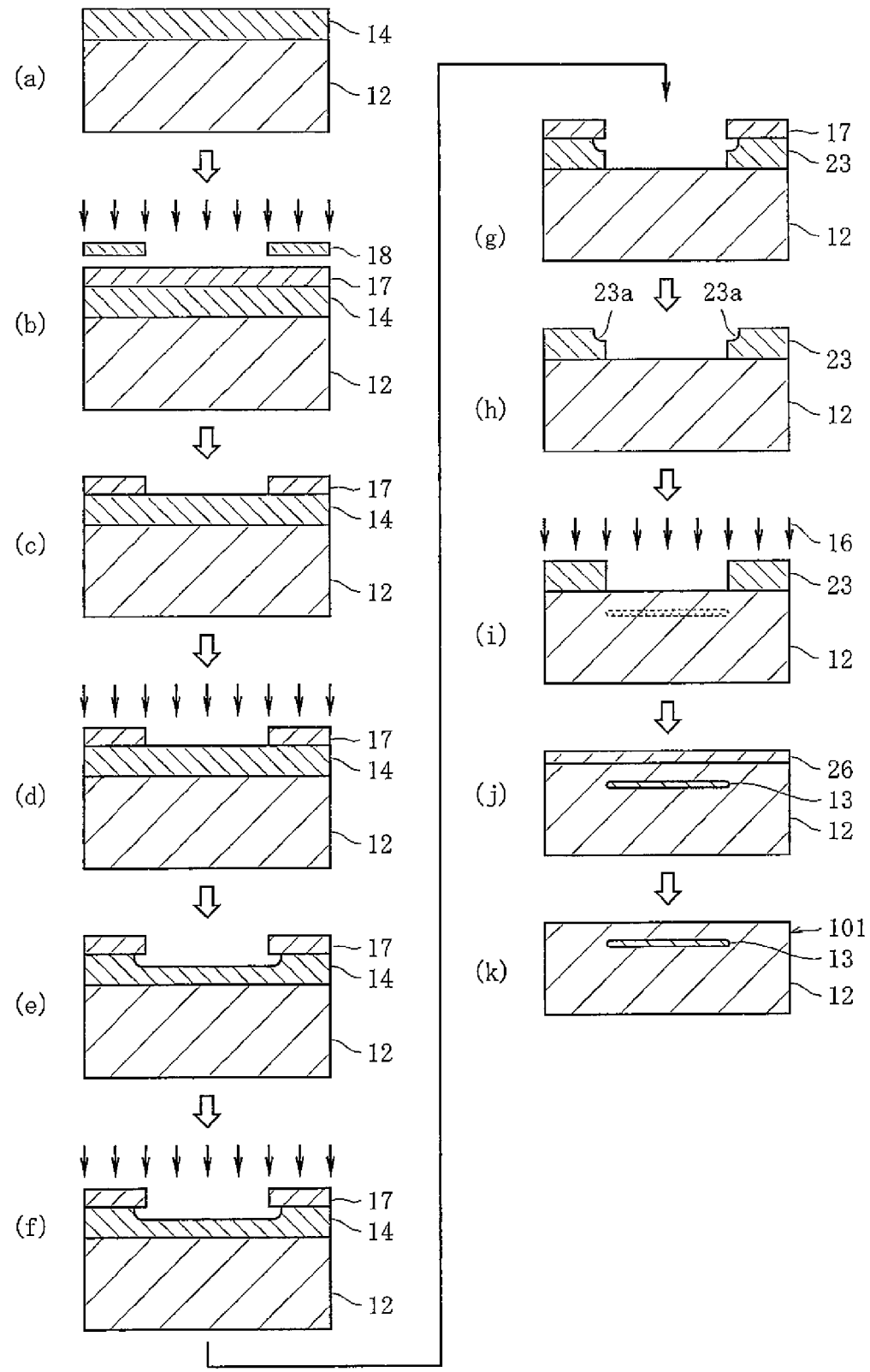
FIG. 9 is sectional view corresponding to FIGS. 1A to 1K, showing ninth embodiment of the present invention.
Figure 10:
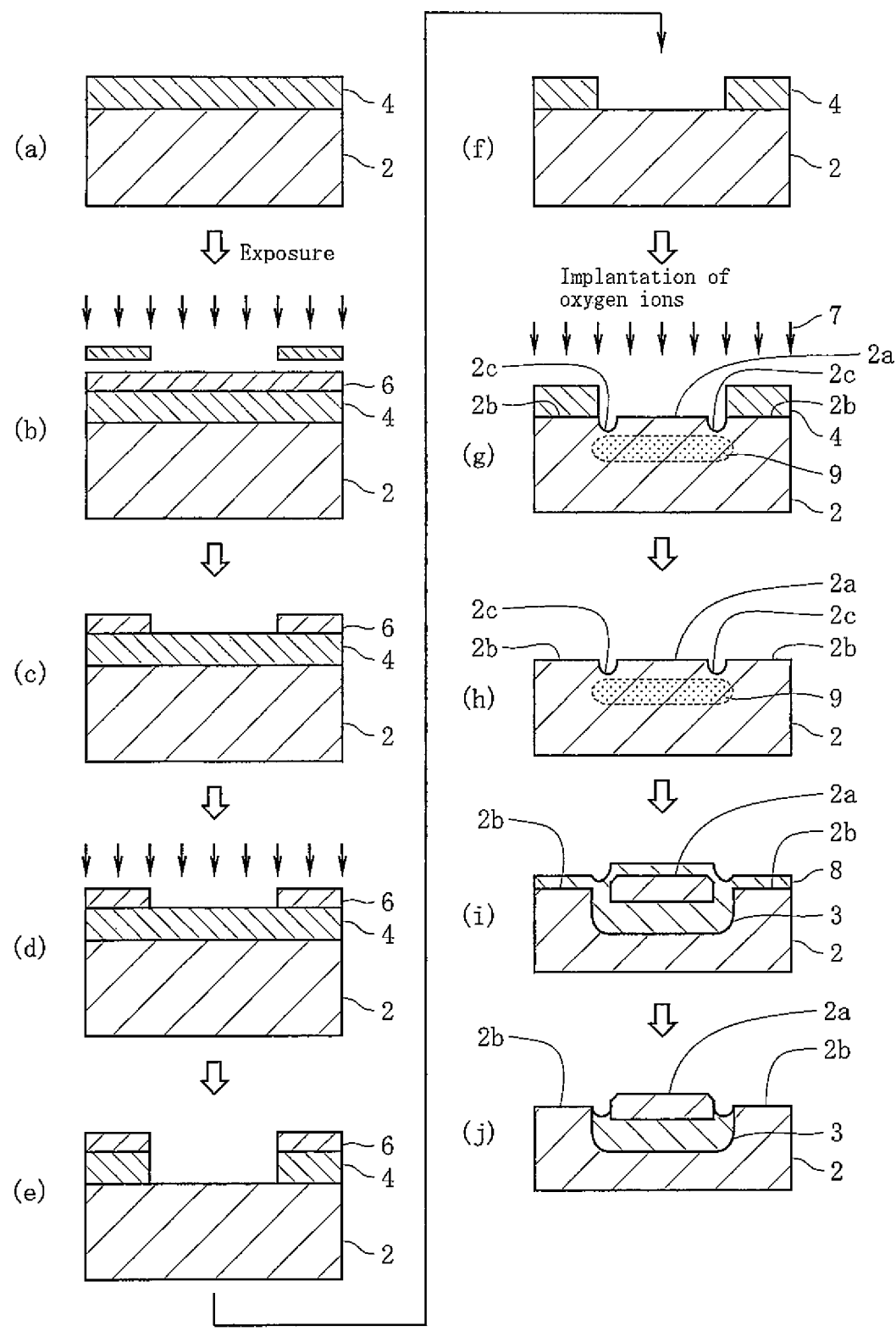
FIG. 10 is sectional view corresponding to FIG. 1, showing a conventional example.
Figure 11:
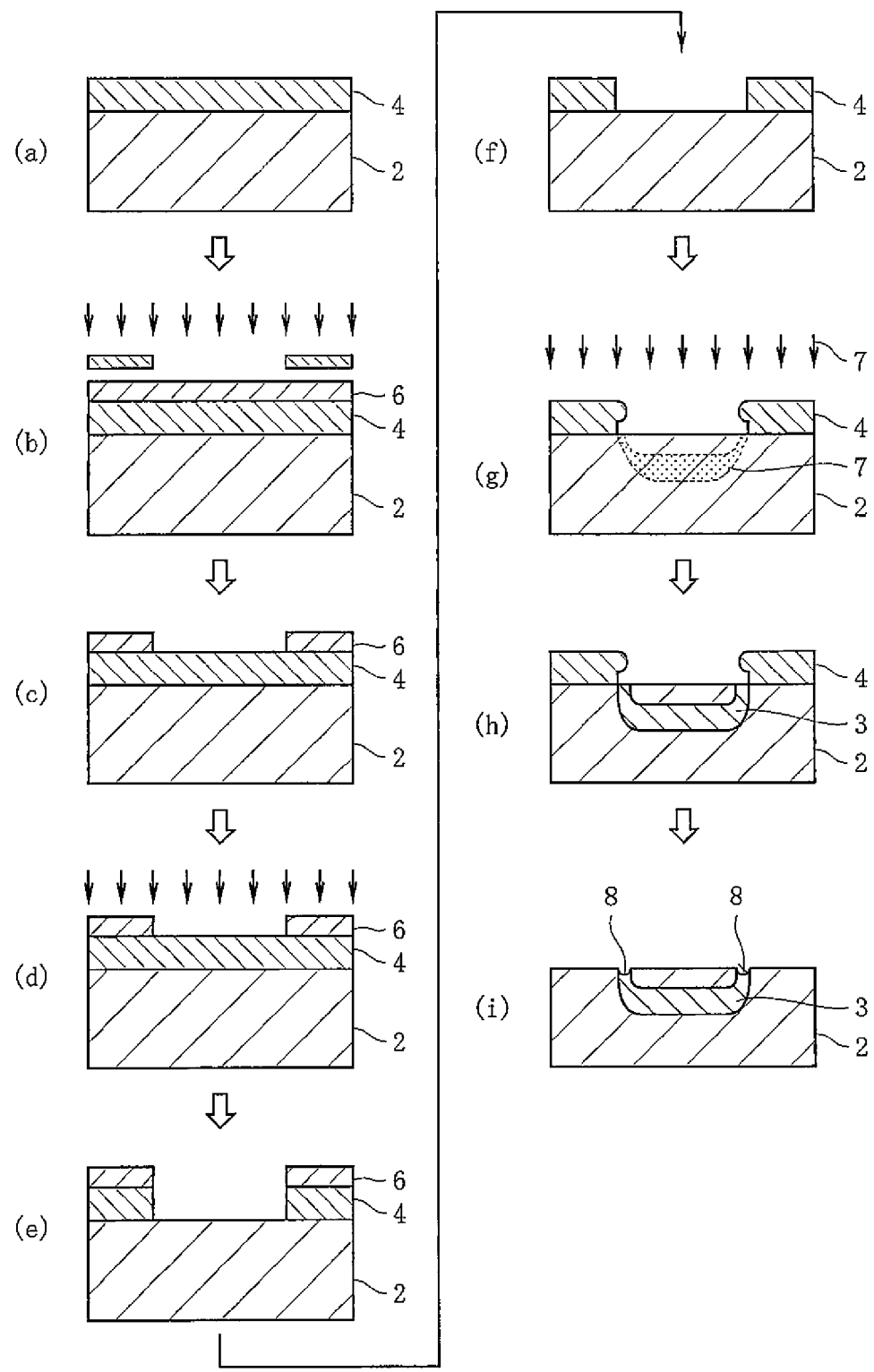
FIG. 11 is sectional view corresponding to FIG. 1, showing another conventional example.

FIG. 9 shows ninth embodiment of the present invention. In FIG. 9, a numeral same as that of the above embodiments denotes the same component and thus repetitive description is omitted.

As shown in FIG. 9, the method of this example is characterized a feature that a recess portion 23a (FIG. 9(h)) is formed on the upper corner of a mask oxide film 73. Specifically, a step of forming the mask oxide film 73 in this embodiment includes a step of forming a surface oxide film 14 on the surface of a substrate 12 (FIG. 9(a)) and a step of forming a resist layer 17 having a predetermined pattern on the surface of the surface oxide film 14 (FIGS. 9(b) and 9(c)). Because these steps are the same as the above-described third and fourth embodiments, repetitive description is omitted.

Moreover, the surface oxide film 14 is etched to obtain a mask oxide film 73 by using the resist layer 17 as a mask. A feature lies in the fact that the etching is performed at two stages. That is, a step of forming the mask oxide film 73 includes a step of forming the resist layer 17 followed by performing isotropic etching to decrease the thickness of a surface oxide film 14 not masked by the resist layer 17 (FIGS. 9(d) and 9(e)) and a step of vertically anisotropically etching the surface of the substrate 12 by using the resist layer 17 as a mask followed by removing the surface oxide film 14 decreased in thickness (FIGS. 9(f) and 9(g)). Anisotropic etching is performed equally in all directions and thereby, the surface oxide film 14 is etched over the downside of the resist layer 17. The isotropic etching includes HF wet etching and chemical dry etching. Meanwhile, anisotropic etching etches the surface oxide film 14 vertically to the surface of the substrate 12. Therefore, the surface oxide film 14 at a portion not covered with the resist layer 17 is etched. Thus, by removing the resist layer 17 and leaving the partially-left surface oxide film 14 on the surface of the substrate 12 as the mask oxide film 73, a recess portion 23a is formed at the upper corner of the obtained mask oxide film 73 (FIG. 9(h)).

Thereafter, oxygen ions 16 are implanted into the surface of the substrate 12 by using the mask oxide film 73 as a mask (FIG. 9(i)). After implanting oxygen ions 16, the mask oxide film 73 is removed from the surface of the substrate 12 through wet etching to perform the annealing where the substrate 12 is held in an oxidizing atmosphere in the temperature range between 1,300 and 1,380° C. for 2 to 20 hours and then slowly cooled the substrate 12 (FIG. 9(i)). Oxidation of a portion into which oxygen ions 16 are implanted of the substrate 12 is accelerated by the annealing and the buried oxide film 13 is formed inside the substrate 12. At the same time, the oxidized layer 26 by annealing is formed on the surface of the substrate 12. By forming the buried oxide film 13 through the above annealing and then immersing the above substrate 12 in a mixed solution (etching solution) of hydrofluoric-acid ammonium aqueous solution and hydrofluoric acid to remove the oxidized layer 26 (FIG. 9(k)), an SOI substrate 101 in which the buried oxide film 13 is formed inside the substrate 12 is obtained.

In the method of the ninth embodiment, Since the recess portion 23a is formed on the upper corner of the mask oxide, even if the upper margin of the mask oxide film 73 is deformed so as to expand when oxygen ions 16 are implanted, the deformed portion does not protrude to a portion not covered with the mask oxide film 73 nor change the implantation depth of oxygen ions 16 to be implanted. Therefore, the depth of the buried oxide film 13 obtained through implantation of oxygen ions 16 becomes uniform and it is possible to effectively prevent the edge area of the buried oxide film from being exposed on the surface of the substrate 12.

What is claimed is:

1. A method for manufacturing an SOI substrate comprising a step of partially forming a mask oxide film (23) on the surface of a silicon substrate (12), a step of implanting oxide ions (16) into the surface of the substrate (12) through the mask oxide film (23), and a step of annealing the substrate (12) to form a buried oxide film (13) inside the substrate (12), further comprising between the step of implanting the oxygen ions (16) and the step of annealing the substrate (12):
   a step of etching the mask oxide film (23) so as to become a predetermined thickness; and
   a step of forming a buffer film (42) on a predetermined-width boundary area contacting with the side of the mask oxide film (23) on a silicon substrate surface (12a) serving as the SOI area and on the side of the mask oxide film (23).

2. The method according to claim 1, wherein a buffer film (32, 42 or 52) is formed by any one of silicon nitride, polysilicon, and a silicon.

* * * * *